(12) United States Patent
Fujimoto

(10) Patent No.: US 8,436,409 B2
(45) Date of Patent: May 7, 2013

(54) SEMICONDUCTOR DEVICE

(75) Inventor: Hiroyuki Fujimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 75 days.

(21) Appl. No.: 13/222,543

(22) Filed: Aug. 31, 2011

(65) Prior Publication Data

US 2012/0049261 A1 Mar. 1, 2012

(30) Foreign Application Priority Data

Aug. 31, 2010 (JP) ................................. 2010-194448

(51) Int. Cl.
*H01L 27/108* (2006.01)
*H01L 29/94* (2006.01)

(52) U.S. Cl.
USPC ............ 257/302; 257/E29.262; 257/E21.654; 438/585

(58) Field of Classification Search ........................ None
See application file for complete search history.

(56) References Cited

U.S. PATENT DOCUMENTS 4,672,410 A * 6/1987 Miura et al. .................. 257/302
2008/0296677 A1* 12/2008 Takaishi ........................ 257/336

FOREIGN PATENT DOCUMENTS

JP 2008-288391 11/2008

* cited by examiner

*Primary Examiner* — Julio J Maldonado
*Assistant Examiner* — Sonya D McCall Shepard
(74) *Attorney, Agent, or Firm* — Young & Thompson

(57) ABSTRACT

In a semiconductor device of the invention, a semiconductor pillar configuring a vertical MOS transistor has an upper pillar having a first width and a lower pillar having a second width. A side surface of the upper pillar is covered with a second insulation film and a third insulation film and the lower pillar is covered with a first insulation film, which is a gate insulation film, from a side surface thereof to the second insulation film. A gate electrode is insulated from an upper conductive layer by the second and third insulation films.

20 Claims, 18 Drawing Sheets

SEMICONDUCTOR DEVICE

BACKGROUND OF THE INVENTION

1. Field of the Invention

The invention relates to a semiconductor device and a method for manufacturing the same, and more particularly, to a semiconductor device having a vertical transistor and a method for manufacturing the same.

2. Description of the Related Art

Regarding MOSFETs (Metal-Oxide-Semiconductor Field-Effect-Transistor), as the high density thereof has been developed, it is difficult to planarly lay out gates, sources and drains, which are components of the MOSFET. In DRAM (Dynamic Random Access Memory) having a minimum line pitch of about 90 nm or smaller, a three-dimensional layout is required. Here, the three-dimensional layout refers to a structure (hereinafter, referred to as vertical MOS transistor) in which a source and a drain (S/D) are provided above and below a pillar of a semiconductor (hereinafter, referred to as semiconductor pillar and when the semiconductor is silicon, it is referred to as silicon pillar) formed in a normal direction to a semiconductor substrate, a gate insulation film and a gate electrode (word line) are arranged on a surface of the silicon pillar and the respective components are overlapped in the normal direction of the semiconductor substrate.

For example, JP2008-288391A (hereinafter referred to as Reference 1) discloses a semiconductor device having a vertical MOS transistor of a structure shown in Drawing 1(a) of Reference 1. As shown, a vertical MOS transistor is disclosed in which a second diffusion layer (26) and a first diffusion layer (18) are arranged at the top and bottom of a first silicon pillar (15A) and a first gate insulation film (19A) and a first gate electrode (20A) are covered on a side surface of the first silicon pillar (15A). In this transistor, the first diffusion layer (18) and a wiring layer (30) are connected by a first contact plug (29a) and the second diffusion layer (26) and the wiring layer (30) are connected by a second contact plug (29b). Accordingly, charges supplied from the wiring layer (30) that is connected to a third contact plug (29c) reach the first gate electrode (20A) through a second gate electrode (20B), so that the transistor formed at the first pillar (15A) operates. As a result, the wiring layers (30) connected to the contact plug (29a) and the contact plug (29b) are made to conduct to each other. The reference numerals in the parentheses indicate those in the drawings of Reference 1, which is the same as the below. In order to stably operate the vertical MOS transistor, it is necessary to completely cover the conduction parts of the charges with an insulation film so as to prevent the charges from being leaked, so that a related method is needed.

In the vertical MOS transistor of Reference 1, the first gate electrode (20A) and the second diffusion layer (26) are insulated by a mask insulation film (14a) that is a silicon oxide film and a sidewall insulation film (25) that is a silicon nitride film. However, in a pre-process of forming the gate insulation film (19A), when wet etching is performed to remove an unnecessary oxide film on the substrate surface, a part of the mask insulation film (14a) is also removed, so that a cavity is formed. More specifically, a sidewall insulation film (16) shown in Drawing 6 of Reference 1 is formed on side surfaces of the first and second silicon pillars (15A), (15B) after an active area (13) is thermally oxidized and thus protected. Accordingly, a silicon oxide film (not shown) is interposed between the sidewall insulation film (16) and the first silicon pillar (15A) and abuts on the silicon oxide film (14a) that is a protective insulation film. From this state, in order to expose the side surface of the first silicon pillar (15A) so as to form the gate insulation film (19A), it is necessary to remove the sidewall insulation film (16) and the silicon oxide film that is a basis thereof by the wet etching, as shown in Drawing 9 of Reference 1. At this time, a part of the side surface of the silicon oxide film (14a) is also removed, so that a void is formed thereto.

The generation of the void is described with reference to FIG. 25. FIG. 25 is a process sectional view for illustrating the problems to be solved and is a partially enlarged view of the first silicon pillar (15A) of Reference 1, in which 100 is respectively added to the reference numerals of Reference 1. First, in FIG. 25(a), like Drawing 6 of Reference 1, a silicon oxide film 114a and a silicon nitride film 114b, which are mask insulation films, are stacked on a first silicon pillar 115A, and a silicon oxide film 116a and a silicon nitride film 116b are formed on a side surface of the first silicon pillar, as sidewall insulation films.

Next, like Drawing 9 of Reference 1, in order to remove the sidewall insulation film 16 and to thus expose the side surface of the first silicon pillar 115A, the silicon nitride film 116b and the silicon oxide film 116a are removed, as shown in FIG. 25(b). In order to speed up the transistor or to realize the low power consumption, the gate insulation film should be formed to be extremely thin. Accordingly, the silicon oxide film 116a should be securely removed so that it does not remain. Hence, a part of the side surface of the silicon oxide film 114a is removed, so that a cavity CV is formed.

Next, as shown in FIG. 25(c), the cavity CV remains even when an extremely thin gate insulation film 119A is formed. Then, a first gate electrode 120A is formed. However, the first gate electrode 120A is embedded in the cavity CV, too (refer to FIG. 25(d)). After that, when the silicon nitride film 114b above the first silicon pillar 115A is removed to form a sidewall 125 and the silicon oxide film 114a exposed into an opening is removed to form a through-hole 123, the first gate electrode 120A in the cavity CV can be exposed into the through-hole 123 (refer to FIG. 25(e)). As a result, a second diffusion layer formed in the through-hole 123 and the first gate electrode 120A can be short-circuited (refer to the broken line in FIG. 25(f)).

SUMMARY

According to the invention, a semiconductor device is provided which can stabilize an operation of a vertical MOS transistor by avoiding removing the mask insulation film 114a in the pre-process and thus preventing short-circuit from being generated.

According to an embodiment, there is provided a semiconductor device including a vertical MOS transistor having upper and lower conductive layers at upper and lower parts in a normal direction of a semiconductor substrate. The vertical MOS transistor includes:

a first semiconductor pillar comprising a first upper pillar having a first width and a first lower pillar having a second width larger than the first width and an upper surface around the first upper pillar on a main surface of the semiconductor substrate;

a first insulation film that is provided on a side surface to at least a part of the upper surface of the first lower pillar;

a second insulation film that is provided on a side surface of at least a part of the first upper pillar, and a third insulation film provided on the second insulation film and upwardly extended beyond an upper surface of the first semiconductor pillar, wherein the side surface of the first semiconductor pillar is continuously covered with the first and second insulation films.

According to an illustrative embodiment of the invention, it is possible to provide a semiconductor device in which an operation of a vertical MOS transistor is stabilized by preventing short-circuit from being generated between an upper conductive layer and a gate electrode of the vertical MOS transistor.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Figure 1A:
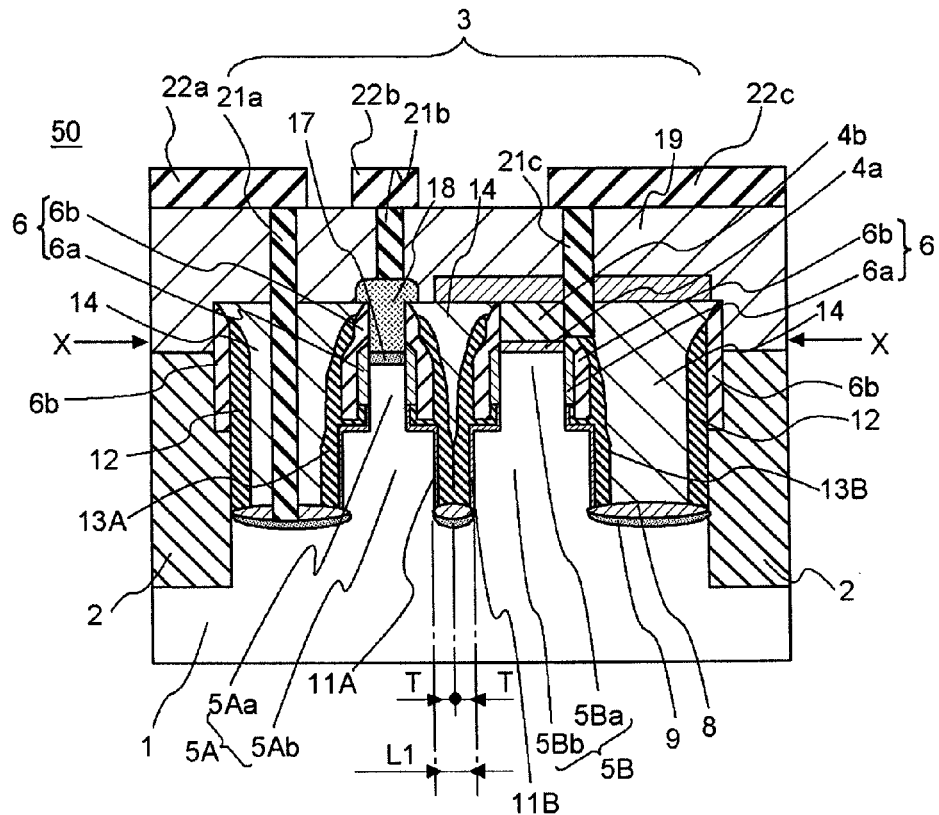
FIG. 1(a) is a schematic sectional view showing a structure of a semiconductor device 50 according to a preferred illustrative embodiment of the invention and FIG. 1(b) is a schematic projective plan view in an XX part of FIG. 1(a).
Figure 1B:
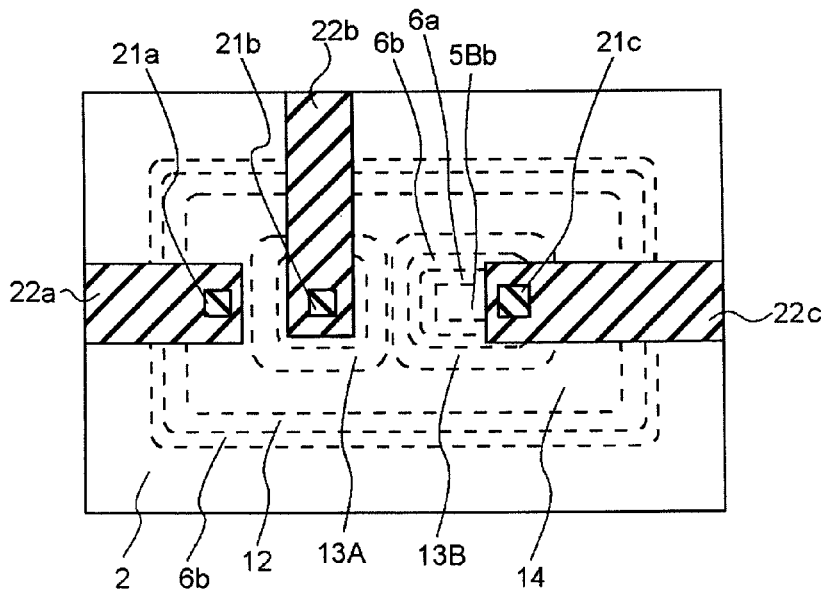

FIG. 1 shows a structure of a semiconductor device 50 according to a preferred exemplary embodiment of the invention, in which FIG. 1(a) is a schematic sectional view and FIG. 1(b) is a schematic projective plan view in an XX part of FIG. 1(a).

As shown in FIGS. 1(a) and 1(b), a semiconductor device 50 of this exemplary embodiment has two semiconductor pillars (hereinafter, referred to as silicon pillars) that are positioned adjacent to each other. One silicon pillar (first semiconductor pillar) 5A is provided with a vertical MOS transistor and the other silicon pillar (second semiconductor pillar) 5B is a dummy pillar that is provided to supply power to a gate electrode of the vertical MOS transistor.

The vertical MOS transistor provided to the first silicon pillar 5A is positioned in an active area 3 that is surrounded by a shallow trench isolation (STI) provided to a semiconductor substrate 1 (hereinafter, referred to as silicon substrate 1), and has a first insulation film 11A, which is a gate insulation film, provided on a side surface of the first silicon pillar 5A, a first conductive film 13A, which is a gate electrode, covering the gate insulation film 11A, a first diffusion layer 9 (which is also referred to as 'lower conductive layer'), which is a conductive layer provided around the bottom of the first silicon pillar 5A, and a second diffusion layer 18 (which is also referred to as 'upper conductive layer'), which is a conductive layer provided on an upper surface of the first silicon pillar 5A. Likewise, the second silicon pillar 5B, which is a dummy pillar provided in the active area 3, also has a first insulation film 11B (dummy gate insulation film), a second conductive film 13B (dummy gate electrode), and a protective insulation film 4a and a cap insulation film 4b instead of the second diffusion layer 18. In the specification, the first (gate) insulation film 11A and the first (dummy gate) insulation film 11B are also collectively referred to as 'gate insulation film' or 'first insulation film 11' and the first conductive film (gate electrode) 13A and the second conductive film (dummy gate electrode) 13B are also collectively referred to as 'gate electrode 13' or 'conductive film 13.' The first diffusion layer 9 is positioned not in an area just below the silicon pillars 5A, 5B but in a flat area of the silicon substrate 1 in which the silicon pillars are not provided.

The first diffusion layer 9 is connected to a wiring layer 22a through a first contact plug 21a. The second diffusion layer 18 is connected to the wiring layer 22b through a second contact plug 21b. The gate electrode 13A is electrically connected to the wiring layer 22c through the second conductive film 13B and a third contact plug (which is also referred to as gate contact) 21c.

The first silicon pillar 5A is provided in a substantially vertical direction with respect to a main surface of the silicon substrate 1 and has a first lower pillar 5Ab having a second width on an upper surface of the semiconductor substrate 1 and a first upper pillar 5Aa positioned on the first lower pillar 5Ab and having a first width smaller than the second width. Here, the first upper pillar 5Aa and the first lower pillar 5Ab are also collectively referred to as 'first silicon pillar 5A.' Since the first width of the first upper pillar 5Aa is smaller than the second width of the first lower pillar 5Ab, i.e., the second width is greater than the first width, the first silicon pillar 5A has a step having an upper surface of the first lower pillar 5Ab and a side surface of the first upper pillar 5Aa, which step is referred to as 'first step.'

Like the first silicon pillar 5A, the second silicon pillar (dummy pillar) 5B also has a second lower pillar 5Bb having a fourth width on the upper surface of the semiconductor substrate 1 and a second upper pillar 5Ba positioned on the second lower pillar 5Bb and having a third width smaller than the fourth width. The second upper pillar 5Ba and the second lower pillar 5Bb are also collectively referred to as 'second silicon pillar 5B.' In the meantime, the respective combinations of the first and third widths and the second and fourth widths of the silicon pillars 5A, 5B can be the same or different. However, it is preferable that the third and fourth widths of the second silicon pillar 5B are respectively greater than the first and second widths of the first silicon pillar 5A. Also, at the lower parts of the silicon pillars 5A, 5B, the gate electrode 13A provided on the side surface of the first lower pillar 5Ab and the dummy gate electrode 13B provided on the side surface of the second lower pillar 5Bb are closely arranged so that the gate electrodes are contacted to each other.

In the semiconductor device 50 of this exemplary embodiment, it is preferable that a size of the second silicon pillar 5B in a plane direction is greater than that of the first silicon pillar 5A. Although not specially limited, it can be set so that a plane size of the first lower pillar 5Ab is about 70×70 nm and a plane size of the second lower pillar 5Bb is about 100×70 nm. Thereby, since it is possible to separate the second contact plug 21b and the gate contact 21c, it is possible to enlarge a formation margin of the wiring layer 22. In addition, since a plane area of the dummy gate electrode 13B of the second upper pillar 5Ba is enlarged, it is possible to securely connect the dummy gate electrode 13B and the gate contact 21c. A height of each silicon pillar can be set depending on required characteristics of the transistor. For example, when a plane size of the first silicon pillar 5A is about 70×70 nm, a height of the silicon pillar can be set to be about 150 nm.

The gate electrode 13A is formed to cover the gate insulation film 11A, which is provided on the side surface of the first lower pillar 5Ab and on an upper surface of at least a part thereof, and a part of a sidewall mask 6, which is provided on the side surfaces from the first upper pillar 5Aa to the second diffusion layer 18. The sidewall mask 6 has a stacked structure having a protective insulation film 6a that is a second insulation film and a cap insulation film 6b that is a third insulation film. Here, the protective insulation film 6a that is provided on a side surface of at least a part of the first upper pillar 5Aa also covers a bottom part of the second diffusion layer 18. A lower part of the cap insulation film 6b contacts the first lower pillar 5Ab via the gate electrode 13A and the gate insulation film 11A. An upper part of the cap insulation film 6b covers a part of the side surface from the bottom part of the second diffusion layer 18.

In the meantime, the dummy gate electrode 13B is provided to cover the dummy gate insulation film 11B positioned on the side surface of the second lower pillar 5Bb and the sidewall mask 6 positioned on the side surfaces from the second upper pillar 5Ba to the cap insulation film 4b (fifth insulation film 4b). Also in the second upper pillar 5Ba, the protective insulation film 6a and cap insulation film 6b configuring the sidewall mask 6 are stacked and the protective insulation film 6a is provided to cover the side surface of the protective insulation film 4a (fourth insulation film 4a). Accordingly, the cap insulation film 6b and the second upper pillar 5Ba are contacted in the same manner as the first silicon pillar 5A. Here, the first insulation film 11B is a dummy gate insulation film that is formed simultaneously with the gate insulation film 11A, and functions as an insulation film. However, it does not function as a gate insulation film of the transistor.

The protective insulation film 4a is a part of a mask that is used when forming the first and second upper pillars 5Aa and 5Ba, and is comprised of a silicon oxide film. The protective insulation film 6a (second insulation film 6a) is formed to be thicker than the gate insulation film 11 (first insulation film 11) and a step formed with the contact parts of the first insulation film 11 and the second insulation film 6a is referred to as 'second step.' Both the conductive films 13A and 13B are provided to fill the second step. In the drawings, the protective insulation films 4a, 6a, the cap insulation film 4b, 6b and the cap insulation film 6b and the STI 2 are respectively distinguished for explanations. However, they are made of the same material in an actual device and thus combined.

The cap insulation film 4b is provided above the second upper pillar 5Ba. Although this cap insulation film 4b is a part of a hard mask that is used when forming the upper pillars 5Aa and 5Ba, it is not removed and is used as the insulation film in a subsequent process. The hard mask is also present above the first upper pillar 5Aa but is removed when forming the second diffusion layer 18.

The gate electrode 13 (13A and 13B) is positioned on the outer peripheries of the corresponding gate insulation film 11 (11A and 11B), respectively, and fill the second step. In particular, the dummy gate electrode 13B has a ring-shaped upper area covering the periphery of the cap insulation film 4b via the cap insulation film 6b and the gate contact 21c is connected to the ring-shaped upper area. More specifically, the gate contact 21c is connected to an interface of the dummy gate electrode 13B with the cap insulation films 4b and 6b remaining on the upper side of the second silicon pillar 5B.

The first diffusion layer 9 is provided at a bottom part of the active area 3, i.e., below the insulation film 8 made of a silicon oxide film around the bottom parts of the lower pillars 5Ab and 5Bb embedded by an interlayer insulation film 14. The second diffusion layer 18 is provided on the upper surface of the first upper pillar 5Aa. The first diffusion layer 9 and the second diffusion layer 18 can be formed by ion-implanting impurities having an opposite conduction type to impurities in the silicon substrate.

The second diffusion layer 18 is connected to a lightly doped drain (LDD) region 17 that is positioned on the top of the first upper pillar 5Aa. The cylindrical sidewall mask 6 that insulates the gate electrode 13A is positioned on a wall surface of the second diffusion layer 18, so that the insulation is secured between the second diffusion layer 18 and the gate electrode 13A. More specifically, the protective insulation film 6a configuring the sidewall mask 6 is provided on the side surface of the first upper pillar 5Aa, so that the lower part of the second diffusion layer 18 is insulated from the gate electrode 13A by the protective insulation film 6a. Accordingly, the bottom surface of the second diffusion layer 18 covered by the sidewall mask 6 has the substantially same shape as the upper surface shape of the first upper pillar 5Aa.

The first to third contact plugs 21a to 21c are formed by filling contact holes penetrating at least an interlayer insulation film 19 with a conductive material. As the material of the contact plugs, polysilicon is preferably used. A lower end of the gate contact 21c is connected to an interface of the dummy gate electrode 13B with the cap insulation films 4b and 6b above the second upper pillar 5Ba.

According to the semiconductor device 50 having the above structure, the first diffusion layer 9 functions as one of a source and a drain and the second diffusion layer 18 functions as the other of the source and the drain. In addition, the gate electrode 13A is electrically connected to the gate contact 21c through the dummy gate electrode 13B and to the wiring layer 22c. A channel region is positioned in the vertical direction of the first lower pillar 5Ab and is controlled by an electric field from the gate electrode 13A through the gate insulation film 11A.

As described above, according to the semiconductor device 50 of this exemplary embodiment, the ring-shaped sidewall mask 6 having the protective insulation film 6a and the cap insulation film 6b is provided on the side surface of the first upper pillar 5Aa. In addition, the second diffusion layer 18 is provided to fill the inside of the upper part of the ring-shaped sidewall mask 6. Since the gate electrode 13A provided on a part of the surface of the sidewall mask 6 is contacted to the protective insulation film 6a in the area sandwiched between the cap insulation film 6b and the gate insulation film 11A, the gate electrode 13A and the second diffusion layer 18 are not short-circuited and are completely insulated, thereby stabilizing the operation of the semiconductor device 50.

In the below, a method for manufacturing the semiconductor device 50 of this illustrative embodiment is specifically described.

FIGS. 2 to 23 illustrate a method for manufacturing the semiconductor device 50 of this exemplary embodiment. These figures show sectional views and optionally plan views. Also, partially enlarged sectional views are shown, as required.

Figure 2A:
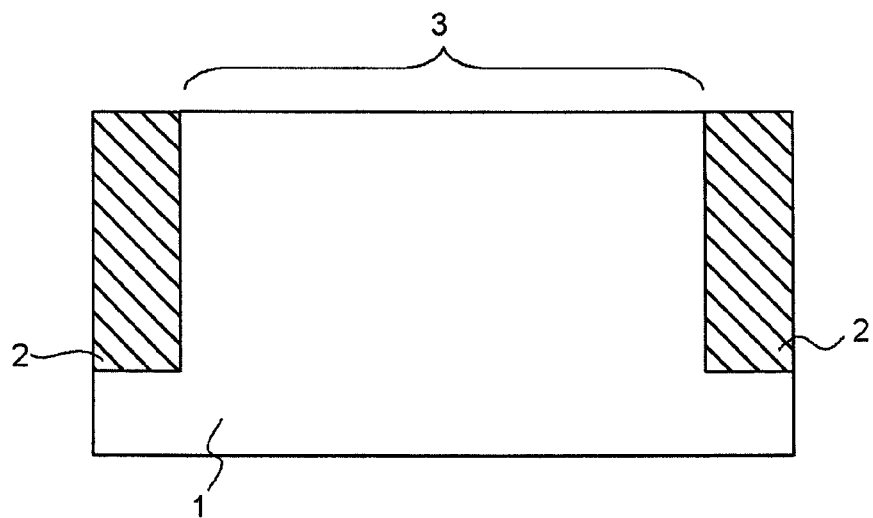
FIG. 2(a) is a schematic sectional view for illustrating a manufacturing process of the semiconductor device 50 of FIG. 1.
Figure 2B:
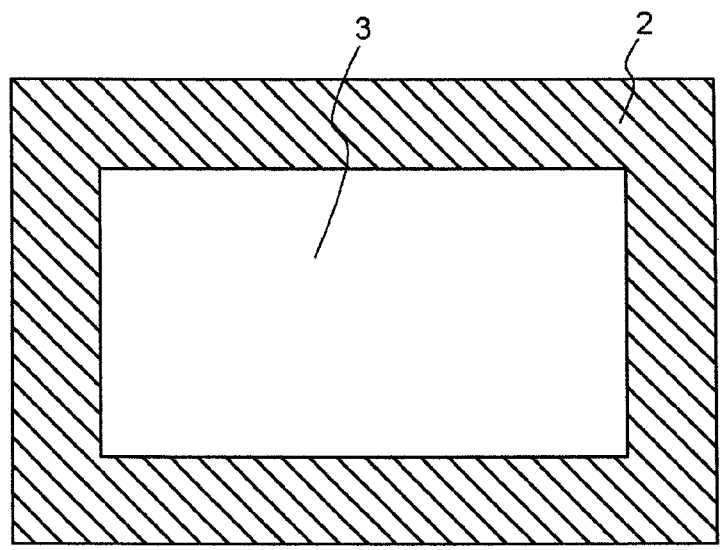
FIG. 2(b) is a plan view.

As shown in FIG. 2, in order to manufacture a semiconductor device 50, a silicon substrate (hereinafter, referred to as 'substrate 1') is first prepared as a semiconductor substrate and an STI 2 is formed on the substrate 1, so that an active area 3 surrounded by the STI 2 is formed. A plurality of active areas is formed in the actual substrate 1 and only one active area is shown in FIG. 2. Although not specially limited, the active area 3 of this exemplary embodiment has a rectangular plane structure, as shown in the plan view of FIG. 2(b).

When forming the STI 2, a recess having a depth of about 270 nm is formed on a main surface of the substrate 1 by a dry etching method, a thin silicon oxide film is formed on a whole surface of the substrate 1 including an inner wall of the recess by thermal oxidation and a silicon nitride film having a thickness of about 400 to 500 nm is deposited on the whole surface of the substrate 1 including the inside of the recess by a chemical vapor deposition (CVD) method. Then, the unnecessary silicon nitride film on the substrate 1 is removed by chemical mechanical polishing (CMP), so that the silicon nitride film remains only in the recess and thus the STI 2 is formed.

Figure 3:
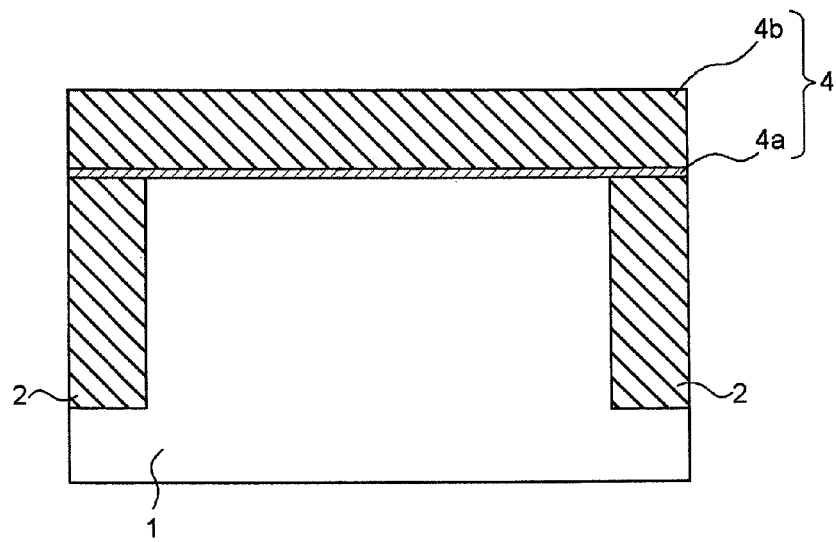
FIGS. 3 and 4 are schematic sectional views for illustrating a manufacturing process of the semiconductor device 50 of FIG. 1.

Next, as shown in FIG. 3, a protective insulation film 4a that is a silicon oxide film and a cap insulation film 4b that is a silicon nitride film are formed on the whole surface of the substrate 1. Although not specially limited, the protective insulation film 4a and the cap insulation film 4b can be formed by the CVD method and the protective insulation film 4a can have a thickness of about 10 nm and the cap insulation film 4b can have a thickness of about 120 nm. In the specification, the protective insulation film 4a and the cap insulation film 4b are also simply referred to as 'hard mask 4.' The hard mask 4 functions as a mask when performing the etching.

Figure 4:
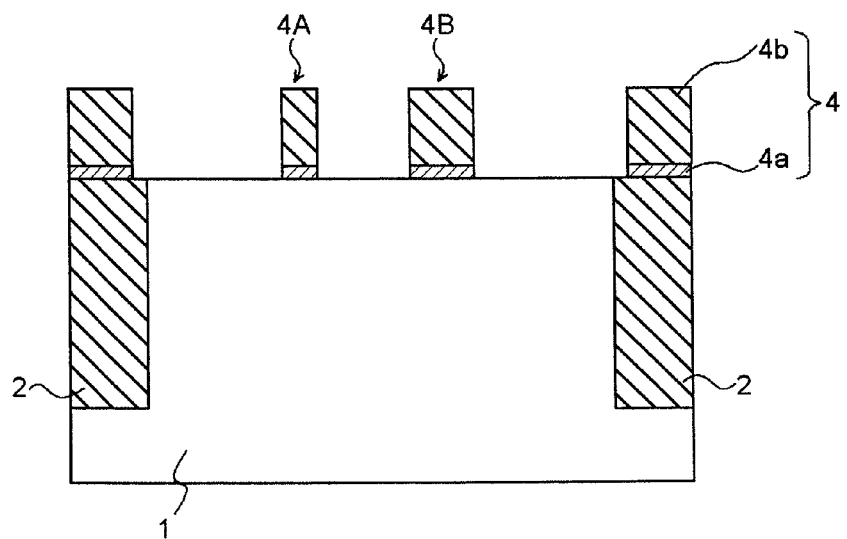

Next, as shown in FIG. 4, the hard mask 4 is patterned by photolithography and dry etching, so that the hard mask 4 remains in areas where upper pillars 5Aa and 5Ba are formed and areas that are beyond the active area 3 and the other hard mask 4 is removed. In the meantime, an edge of the hard mask 4 covering the STI 2 is preferably positioned at a slightly more outer side than an outer periphery of the active area 3 so that the unnecessary silicon pillars are not formed in the active area 3. More preferably, the edge of the hard mask is retreated from the outer periphery of the active area so that a cap insulation film 6b on the sidewall of the STI 2 does not protrude into the active area 3 in a second silicon dry etching that will be described later. In this regard, the hard mask 4 of the areas where the upper pillars 5Aa and 5Ba will be formed is referred to as a first mask 4A and a second mask 4B, respectively.

Figure 5A:
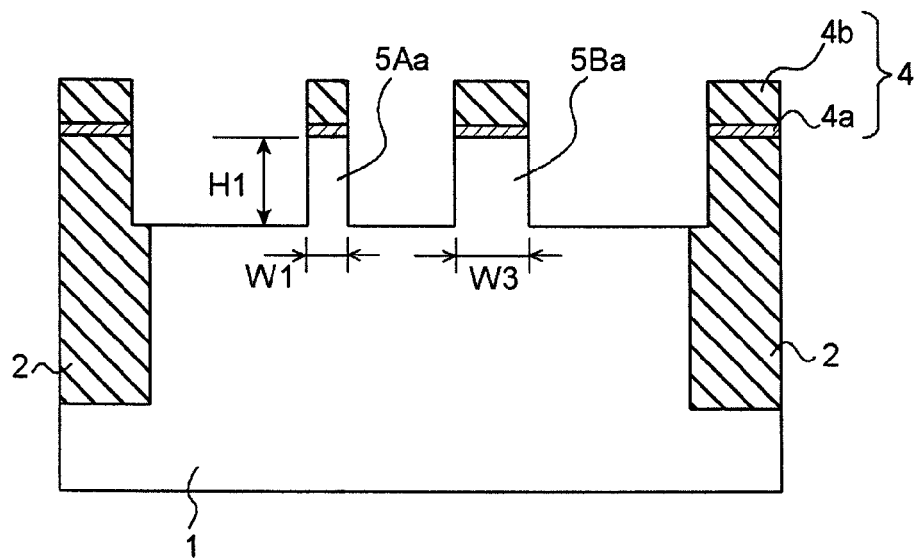
FIG. 5(a) is a schematic sectional view for illustrating a manufacturing process of the semiconductor device 50 of FIG. 1.
Figure 5B:
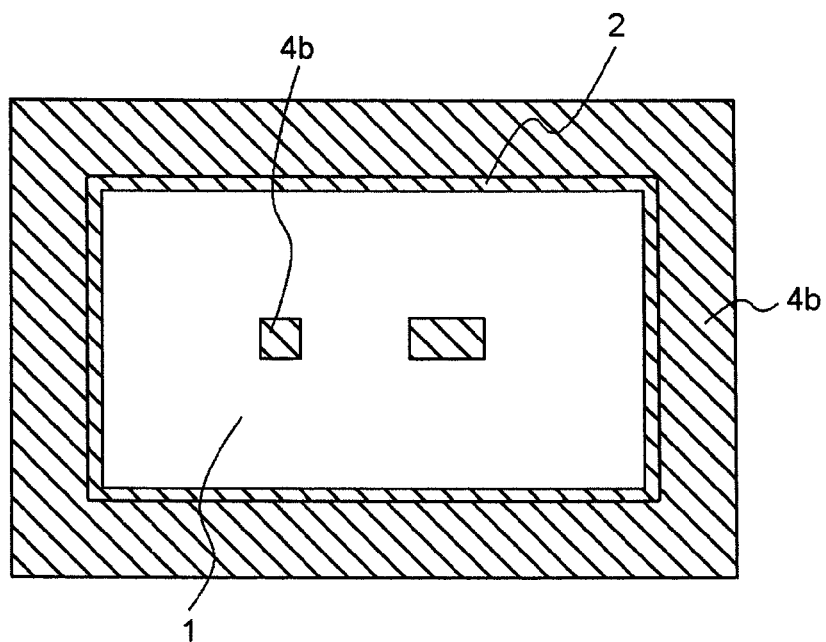
FIG. 5(b) is a plan view.

Next, as shown in FIG. 5, an exposed surface of the active area 3 is etched up to about 50 nm by the dry etching method in which the patterned hard mask 4 is used as an etching mask. Here, FIG. 5(a) is a sectional view and FIG. 5(b) is a plan view. By the etching process, recessed parts are formed in the exposed surface of the active area 3 and the non-etched parts become upper pillars 5Aa and 5Ba that are substantially vertical to the main surface of the substrate 1 and have a height H1 of about 50 nm. In addition, the first upper pillar 5Aa is formed to have a first width W1 and the second upper pillar 5Ba is formed to have a third width W3. Here, W1 can be about 40 nm and W3 can be about 70 nm. In addition, as shown in the plan view of FIG. 5(b), the widths in the direction perpendicular to the sheet are the substantially same, i.e., the width W1. Here, the first upper pillar 5Aa that will become one vertical MOS transistor and the second upper pillar 5Ba that will become one dummy pillar are formed in the active area 3. However, the invention is not limited thereto. In other words, a plurality of upper pillars 5Aa can be formed. For example, the second upper pillar 5Ba that will be a dummy pillar can be formed in the center and the upper pillars 5Aa that will be vertical MOS transistors can be formed at both sides thereof. In addition, the dummy pillar can be formed to contact the STI 2. Also, when the first silicon pillar 5A is formed adjacent to the STI 2, the dummy pillar can be omitted. Further, the shape of the silicon pillars 5A and 5B is not limited to the shown rectangular shape that is the planar shape and can be circular (including an elliptical shape) or polygonal such as hexagonal or octagonal. Further, the rectangular and circular shapes can be combined for the silicon pillars 5A and 5B. In the meantime, the respective widths W1 to W4 of the silicon pillar 5 indicate widths of long axes (or long diameters). Like this, the upper pillars 5Aa and 5Ba are formed at the same time and the cap insulation film 4b remains above the upper pillars 5Aa and 5Ba. Here, the STI 2 that is not covered by the hard mask 4 is also etched to the same depth as the exposed surface of the active area 3 by the dry etching method. In the meantime, although not specially limited, it is preferable to individually dry-etch the active area 3 and the STI 2 by using optimal etching gases for each of the active area and the STI.

Figure 6:
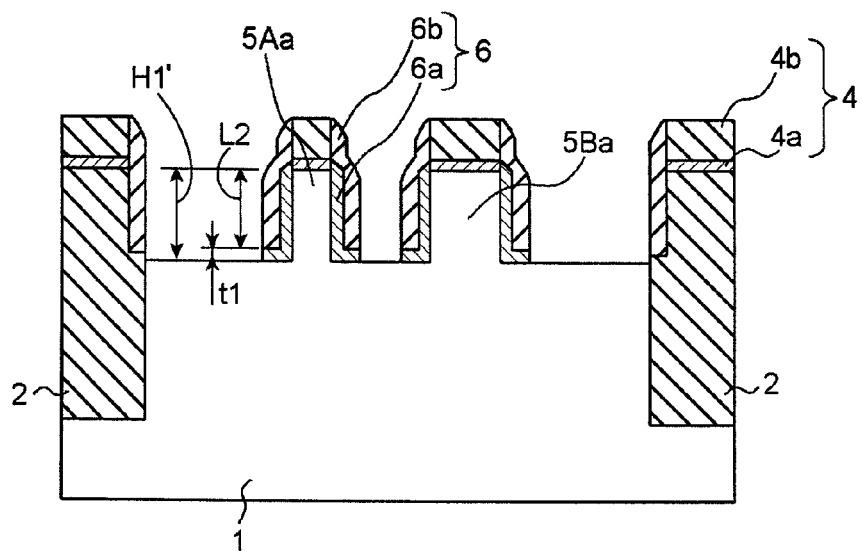
FIG. 6 is a schematic sectional view for illustrating a manufacturing process of the semiconductor device 50 of FIG. 1.

Next, as shown in FIG. 6, a sidewall mask 6 is formed on inner wall surfaces of the upper pillars 5Aa and 5Ba. The sidewall mask 6 can be formed by forming a protective insulation film 6a that is a silicon oxide film and a cap insulation film 6b that is a silicon nitride film and then etching back the films. The protective insulation film 6a can be formed by the thermal oxidation method and the cap insulation film 6b can be formed by the CVD method. Although not specially limited, a film thickness of the protective insulation film 6a can be about 10 nm and a film thickness of the cap insulation film 6b can be about 15 nm. By forming the protective insulation film 6a, a width of the silicon part of the first upper pillar 5Aa becomes narrower than the width W1, so that it becomes about 30 nm, and a width of the silicon part of the second upper pillar 5Ba becomes narrower than the width W3, so that it becomes about 60 nm. Also, heights of the upper pillars 5Aa and 5Ba are increased by about 5 nm, so that H1' becomes about 55 nm. By doing so, since the thickness t1 of the protective insulation film 6a is about 10 nm, the upper pillars 5Aa and 5Ba are covered by the sidewall mask 6 having a distance L2(=about 45 nm) from the upper surfaces of the upper pillars 5Aa and 5Ba to a bottom of the cap insulation film 6b. In the specification, the stacked film of the protective insulation film 6a and the cap insulation film 6b is also simply referred to as 'sidewall mask 6.' In the meantime, although the cap insulation film 6b is also formed on the outer peripheral surface of the active area 3 (on the sidewall of the STI), it also functions as the sidewall mask 6. In the meantime, the cap insulation film 6b can be formed of a silicon oxynitride film, instead of the silicon nitride film. The replacement of the silicon nitride film with the silicon oxynitride film is not limited to the protective insulation film 6b and can be applied to the STI 2 and the cap insulation film 4b.

Figure 7A:
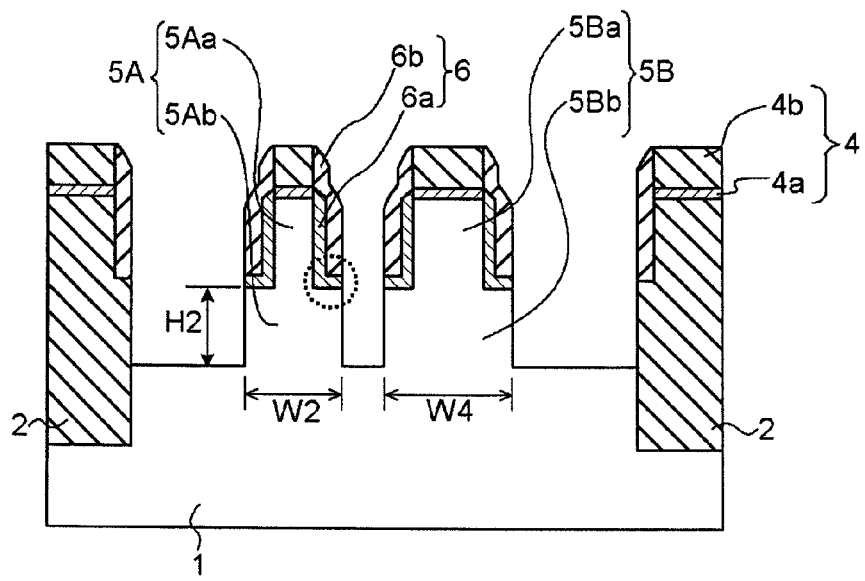
FIG. 7(a) is a schematic sectional view for illustrating a manufacturing process of the semiconductor device 50 of FIG. 1.
Figure 7B:
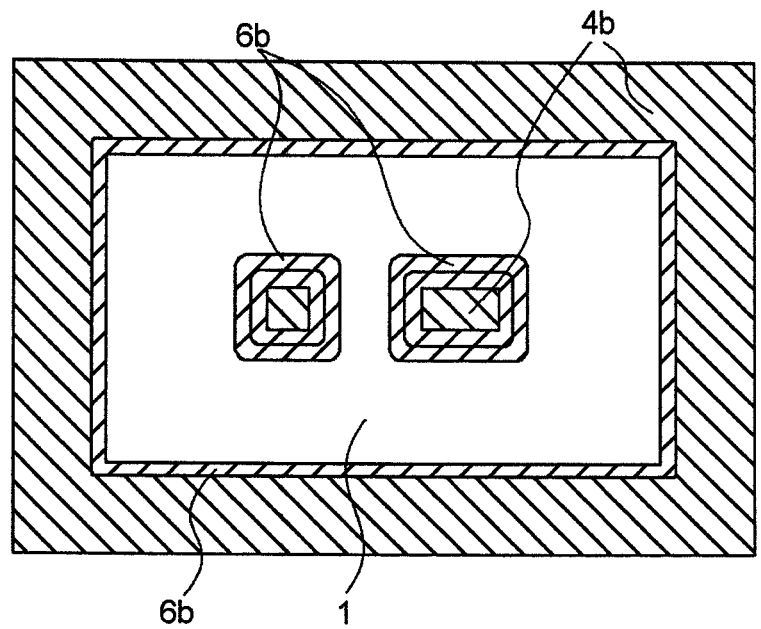
FIG. 7(b) is a plan view.

Next, as shown in FIG. 7, the exposed surface of the active area 3 is etched up to about 100 nm by second silicon dry etching in which the hard mask 4 and the sidewall mask 6 are used as an etching mask. By this dry etching process, recessed parts are formed in the exposed surface of the active area 3 and the non-etched parts become lower silicon pillars 5Ab and 5Bb that are substantially vertical to the main surface of the substrate 1 and have a height H2 of about 100 nm. In addition, the first lower pillar 5Ab is formed to have a second width W2 and the second lower pillar 5Bb is formed to have a fourth width W4. Here, the width W2 is about 80 nm and the width W4 is about 110 nm. In addition, the planar shapes of the lower pillars 5Ab and 5Bb are similar to those of the upper pillars 5Aa, 5Ba. Like this, the lower pillars 5Ab and 5Bb can be formed at the same time. The silicon pillar has two steps of the 'lower silicon pillar 5b' and the 'upper silicon pillar 5a', which are formed in the normal direction of the substrate 1 and have different widths, and a total height thereof is about 155 nm. In addition, as shown with the broken line part in the FIG. 7(a), a step that is configured by the upper surface part of the lower silicon pillar 5b and the side surface part of the upper silicon pillar 5a is referred to as 'first step.'

Figure 8:
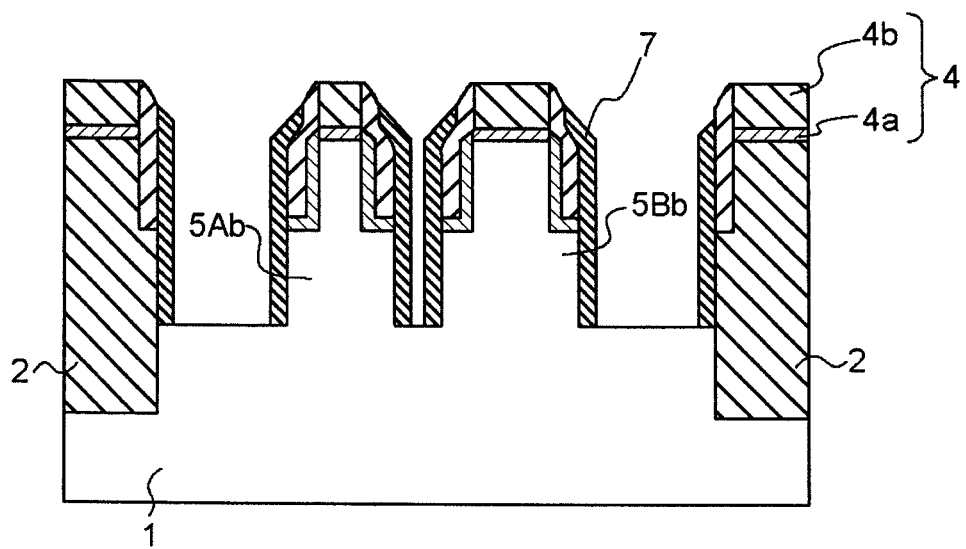
FIGS. 8 to 11 are schematic sectional views for illustrating a manufacturing process of the semiconductor device 50 of FIG. 1.

Next, as shown in FIG. 8, a sidewall insulation film 7 is formed on side surfaces of the lower pillars 5Ab and 5Bb. The sidewall insulation film 7 can be formed by protecting (not shown) the exposed surface of the active area 3 by the thermal oxidation with the hard mask 4 and the sidewall mask 6 being remained, forming a silicon nitride film by the CVD method and etching back the silicon nitride film. Thereby, the inner peripheral surface (STI sidewall) of the active area 3, the whole side surfaces of the lower pillars 5Ab and 5Bb, and a part of the side surface of the cap insulation film 6b are covered by the sidewall insulation film 7.

Figure 9:
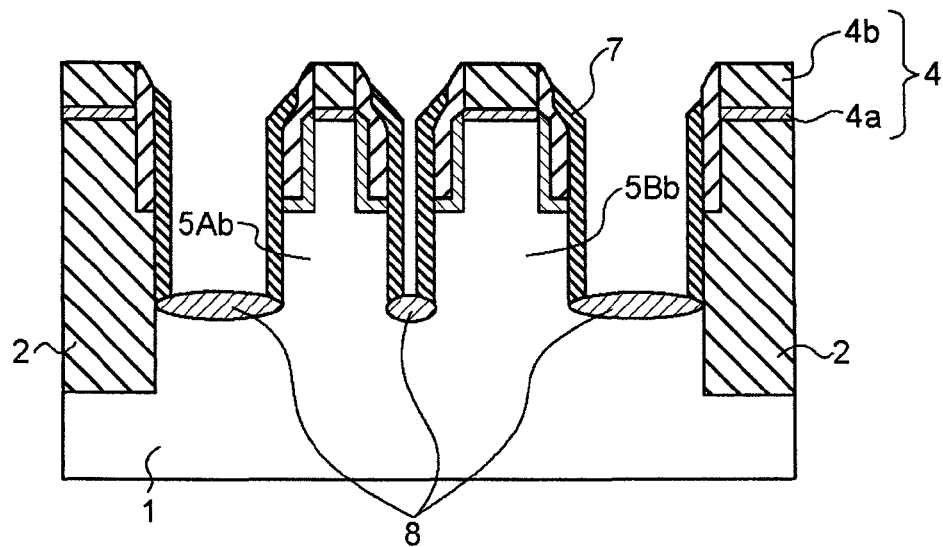

Next, as shown in FIG. 9, an insulation film 8 that is a silicon oxide film is formed on a bottom of the active area 3, which is the exposed surface of the active area 3, by the thermal oxidation. At this time, since the side surfaces of the lower pillars 5Ab and 5Bb are covered by the sidewall insulation film 7, they are not thermally oxidized. Although not specially limited, a film thickness of the insulation film 8 can be about 40 nm.

Figure 10:
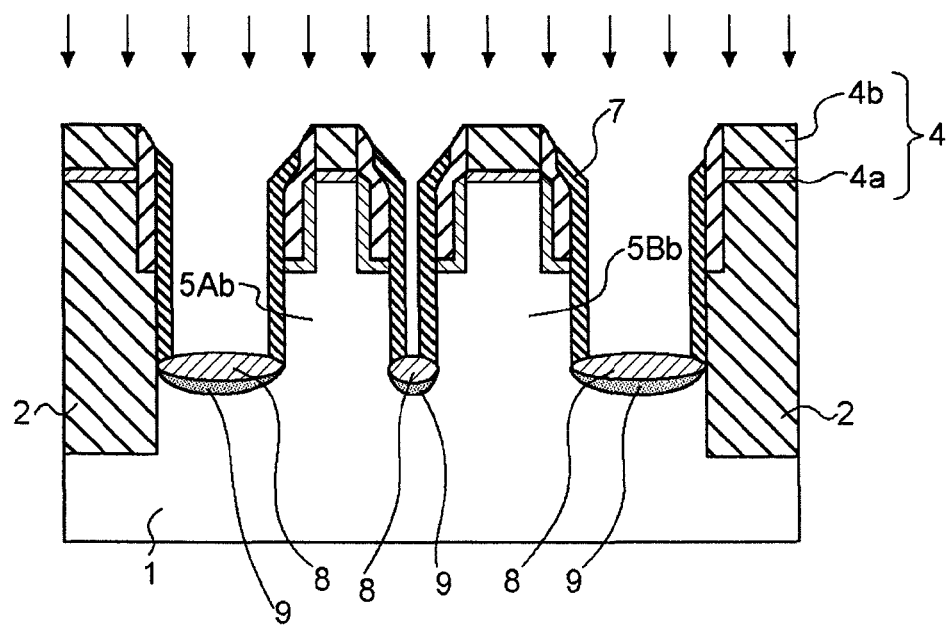

Next, as shown in FIG. 10, a first diffusion layer 9 is formed around the lower part of the silicon pillar 5. The first diffusion layer 9 can be formed by ion-implanting impurities having a conductive type opposite to impurities in the silicon substrate 1 through the insulation film 8 formed on the surface of the active area 3.

Figure 11:
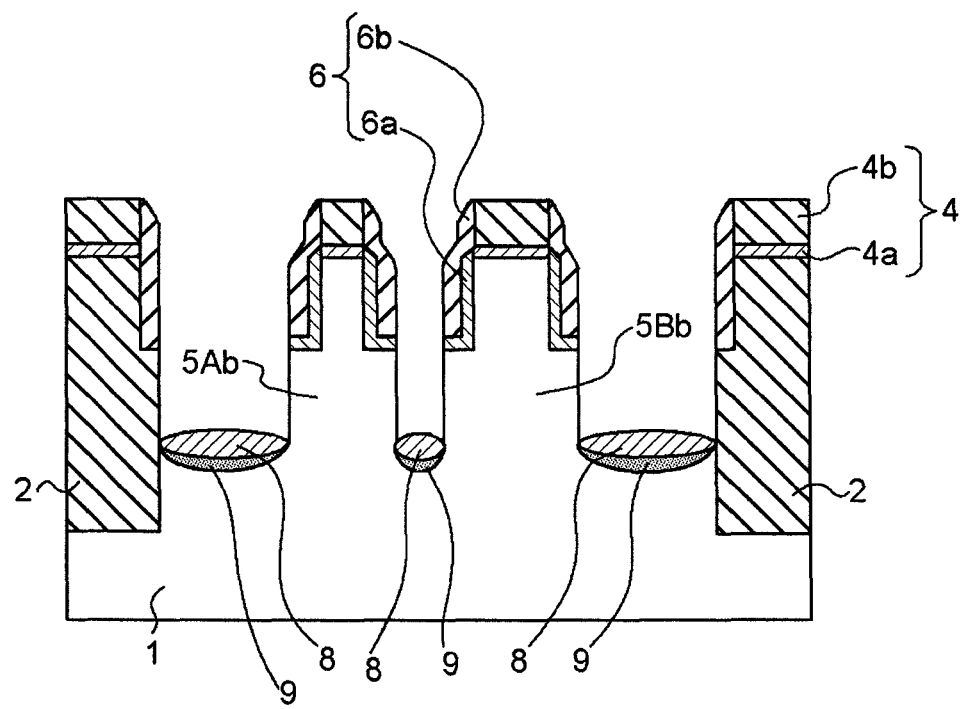

Next, as shown in FIG. 11, the sidewall insulation film 7 is removed by wet etching. Thereby, the insulation film 8 formed on the bottom surface of the active area 3 and the side surfaces of the lower pillars 5Ab and 5Bb are exposed. The upper pillars 5Aa and 5Ba are still covered by the hard mask 4 and the sidewall mask 6. Here, although parts of the cap insulation films 4b and 6b are also removed, the cap insulation film 6b can be made to remain with a film thickness of about 10 nm by controlling the wet etching time.

Figure 12A:
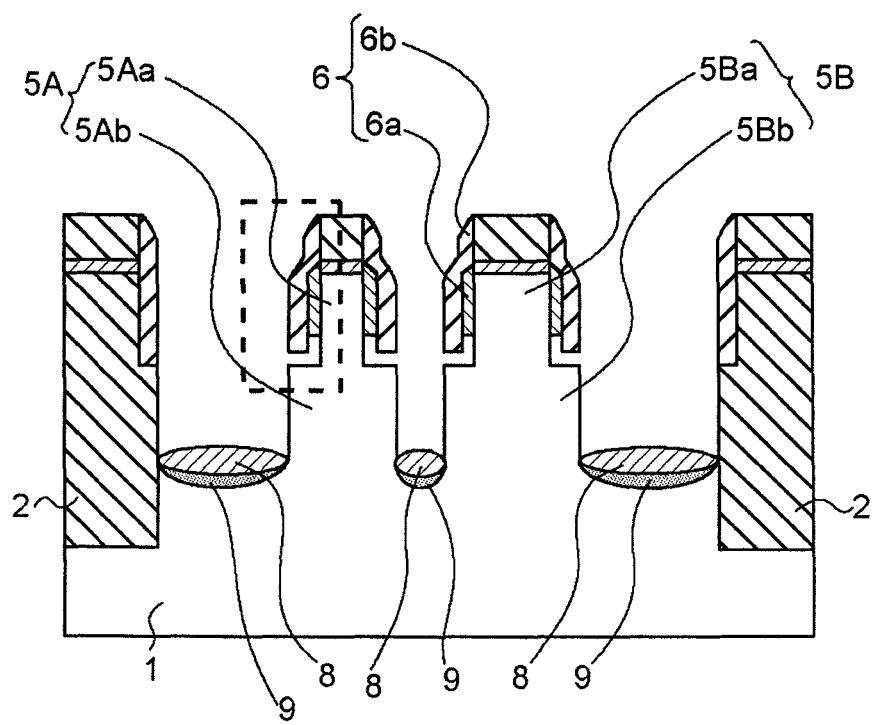
FIG. 12(a) is a schematic sectional view for illustrating a manufacturing process of the semiconductor device 50 of FIG. 1, and FIGS. 12(c) and 12(d) are enlarged views of a broken line part of FIG. 12(a), which show aspects depending on a difference of etching time.
Figure 12C:
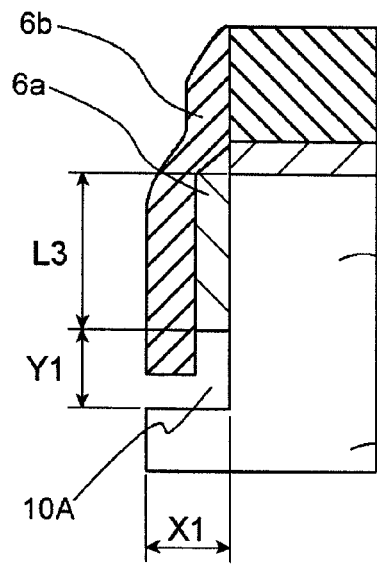

Next, as shown in FIG. 12, as a pre-process for forming a gate insulation film on the side surfaces of the lower pillars 5Ab and 5Bb, the thermal oxidation film remaining on the side surfaces of the lower pillars 5Ab and 5Bb is removed by isotropic etching. As an example in which the isotropic etching is performed by wet etching, in a chemical solution that is used in the wet etching, hydrogen fluoride (HF) is mixed which has different etching rates in the silicon oxide film and the silicon nitride film (more specifically, which removes only the silicon oxide film without acting on the silicon nitride film). Therefore, a part of the protective insulation film 6a of the sidewall mask 6 remaining on the side surfaces of the upper pillars 5Aa and 5Ba is removed and the cap insulation film 6b is not removed, so that a void is formed. More specifically, an etching rate of the silicon oxide film by the chemical solution in which hydrogen fluoride (HF), ammonium fluoride ($NH_4F$) and water ($H_2O$) are mixed in a ratio of 1.6%, 39% and 59% is about 20 nm/minute. When the chemical solution is used and the removing time is sufficiently prolonged, i.e., 90 seconds so that the thermal oxidation film is not remained, as shown in FIG. 12(c) that is an enlarged view of the broken line part in FIG. 12(a), the protective insulation film 6a is removed from the upper surface of the first lower pillar 5Ab to a part of the side surface of the first upper pillar 5Aa, so that a void 10A having a depth X1 of about 25 nm and a height Y1 of about 20 nm is formed. As the void 10A is formed, the protective insulation film 6a is reduced.

Figure 12D:
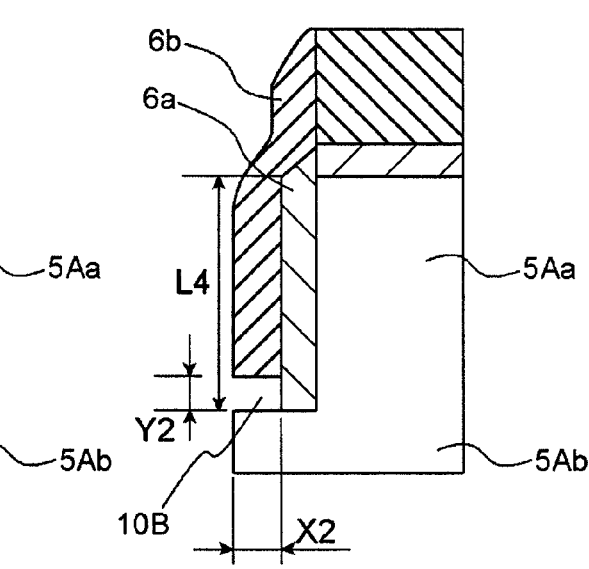

However, a distance L3 to the protective insulation film 4a remains which is about 35 nm. In addition, the insulation film 8 also remains in a film thickness of about 10 nm. To the contrary, when the removing time is adjusted to 30 seconds with respect to the thickness of the thermal oxidation film, as shown in FIG. 12(d), a void 10B is formed in which the protective insulation film has been removed to a part of the upper surface of the first lower pillar 5Ab. A depth X2 of the void is about 10 nm and a height Y2 is about 10 nm that is the same as the film thickness of the protective insulation film 6a. As the void 10B is formed, the protective insulation film 6a is reduced. However, a distance L4 to the protective insulation film 4a remains which is about 55 nm that is the height of the first upper pillar 5Aa. This is the same as the upper silicon pillar 5B.

As described above, according to this exemplary embodiment, the distance of the remaining protective insulation film 6a is L3 when the void 10A is formed, which is about 35 nm. However, it is sufficient that the protective insulation film of about 20 nm or greater remains. And, the height Y1 is about 20 nm. Hence, the necessary heights of the upper pillars 5Aa and 5Ba are about 40 nm or higher. This is little changed depending on the film thickness of the protective insulation film 6b. In the specification, the void 10A and the void 10B can be simply referred to as 'void 10.' Here, the heights of the upper pillars 5Aa and 5Ba are set so that all of the protective insulation film 6a is not removed even when the wet etching is performed for allowed maximum time. The etched amount of the STI 2 is also the same.

Figure 13:
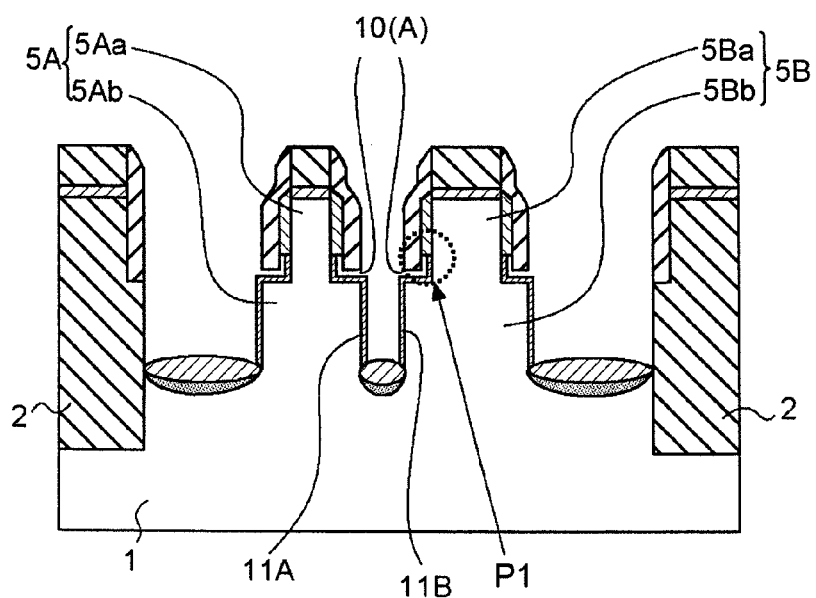
FIG. 13 is a schematic sectional view for illustrating a manufacturing process of the semiconductor device 50 of FIG. 1.

Next, as shown in FIG. 13, gate insulation films 11A, 11B are simultaneously formed on the exposed surface of the silicon pillar 5. The gate insulation film 11 can be formed by the thermal oxidation. Although not specially limited, it is preferable that a film thickness of the gate insulation film is about 5 nm or smaller. In the meantime, since the gate insulation film 11 is thinner than the protective insulation film 6a and thus cannot fill up the void 10, the void 10 remains with a volume thereof being reduced. That is, the protective insulation film 6b (third insulation film 6b) is separated from the first insulation film 11 to form a space (void 10) therebetween. In addition, as shown with the dotted line part, a step that is configured by contact parts of the protective insulation film 6a (second insulation film 6a) and the gate insulation film 11 (first insulation film 11) is referred to as a 'second step.' In addition, the side surface of the second silicon pillar 5a (semiconductor pillar 5a) is continuously covered by the gate insulation film 11 (first insulation film 11) and the protective insulation film 6a (second insulation film 6a).

Figure 14A:
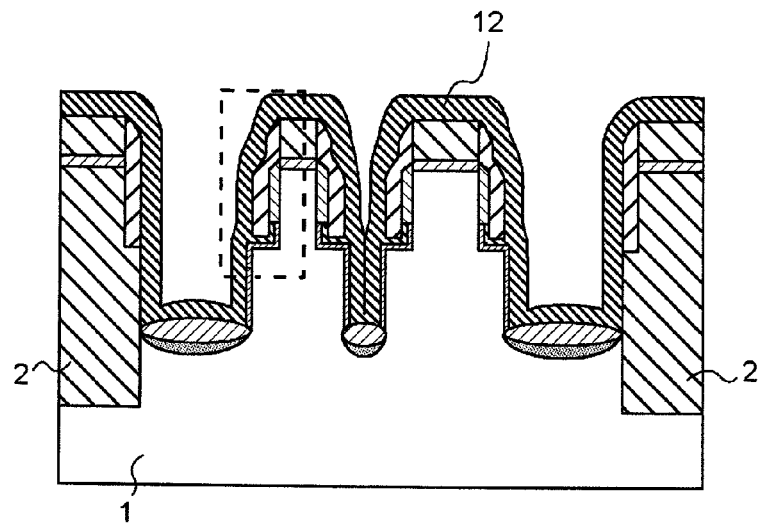
FIG. 14(a) is a schematic sectional view for illustrating a manufacturing process of the semiconductor device 50 of FIG. 1, and FIGS. 14(c) and 14(d) are enlarged views of a broken line part of FIG. 14(a), which correspond to FIGS. 12(c) and 12(d), respectively.
Figures 14C, 14D:
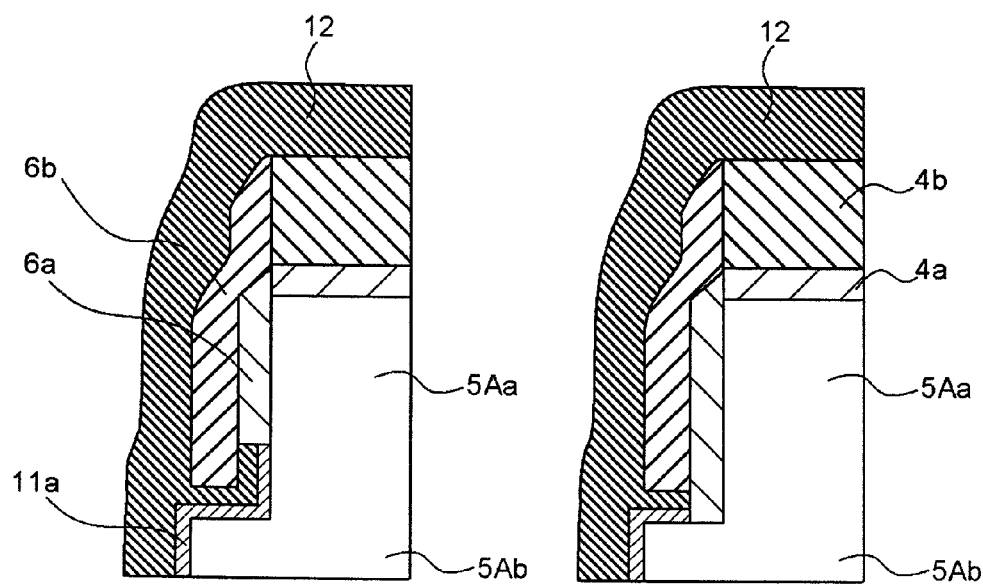

Next, as shown in FIG. 14, a polysilicon film 12 having a film thickness T of about 30 nm is formed, as a conductive film, on the whole surface of the silicon substrate 1 by the CVD method. At this time, as shown in FIG. 14(c) that is an enlarged view of the broken line part in FIG. 14(a), the void 10A is completely filled with by the polysilicon film 12. However, since the protective insulation film 6a remains in the depth direction of the void 10A, the polysilicon film 12 is present only in the void 10A and does not contact the protective insulation film 4a. This is the same as the void 10B, as shown in FIG. 14(d).

Figure 15A:
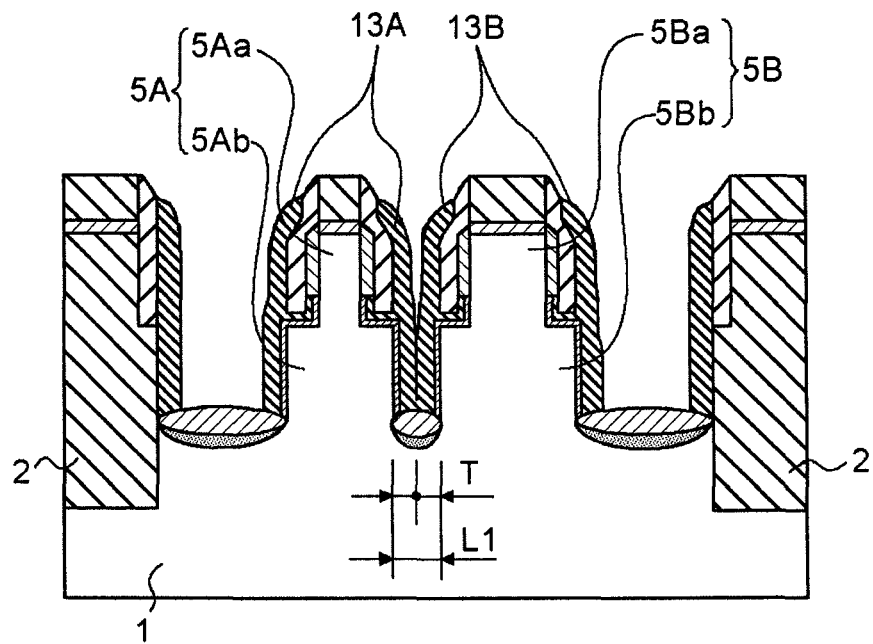
FIG. 15(a) is a schematic sectional view for illustrating a manufacturing process of the semiconductor device 50 of FIG. 1.
Figure 15B:
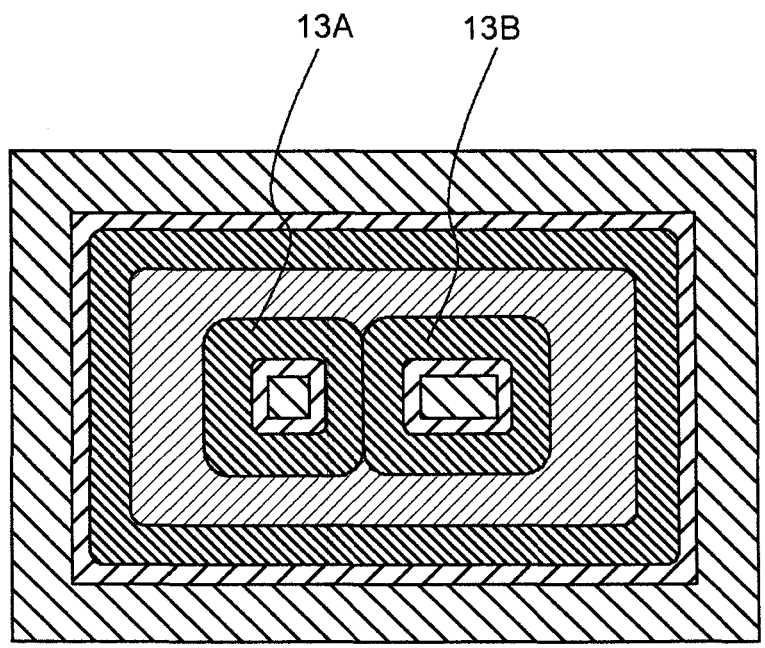
FIG. 15(b) is a plan view.

Next, as shown in FIG. 15, the polysilicon film 14 is etched back to form a gate electrode 13. Thereby, the side surface of the first silicon pillar 5A is covered with the gate electrode 13A and the side surface of the second silicon pillar 5B is covered with the dummy gate electrode 13B. In addition, although the polysilicon film 12 remains on the side surface of the STI 2 too, it does not function as the gate electrode. In addition, since the distance L1 between the silicon pillars 5A and 5B is set to be smaller than twice of the film thickness T of the gate electrode 13, the gate electrodes 13A and 13B formed in the gap between the silicon pillars 5A and 5B are contacted to each other. In the meantime, when the polysilicon film 12 remaining on the side surface of the STI 2 is close to the first silicon pillar 5A, the polysilicon film 12 remaining on the side surface of the STI 2 may function as a floating gate. In this case, the dummy gate electrode 13B of the second silicon pillar 5B becoming a dummy pillar and the polysilicon film 12 remaining on the side surface of the STI 2 are arranged to connect to each other and are electrically connected, so that it is possible to prevent the polysilicon film from functioning as a floating gate. In addition, it can be possible to arrange the first silicon pillar 5A close to the STI without providing the second silicon pillar 5B becoming a dummy pillar and to thus connect the gate electrode 13A to the polysilicon film 12 remaining on the side surface of the STI 2. In this case, a gate contact that will be described in the below can be provided to an arbitrary position on the STI 2. When the gate electrode 13A of the vertical MOS transistor and the polysilicon film 12 on the sidewall of the STI 2 are electrically disconnected, a separate electrode for applying a potential that prevents a floating state to the polysilicon film 12 on the sidewall of the STI 2 can be provided.

Figure 16:
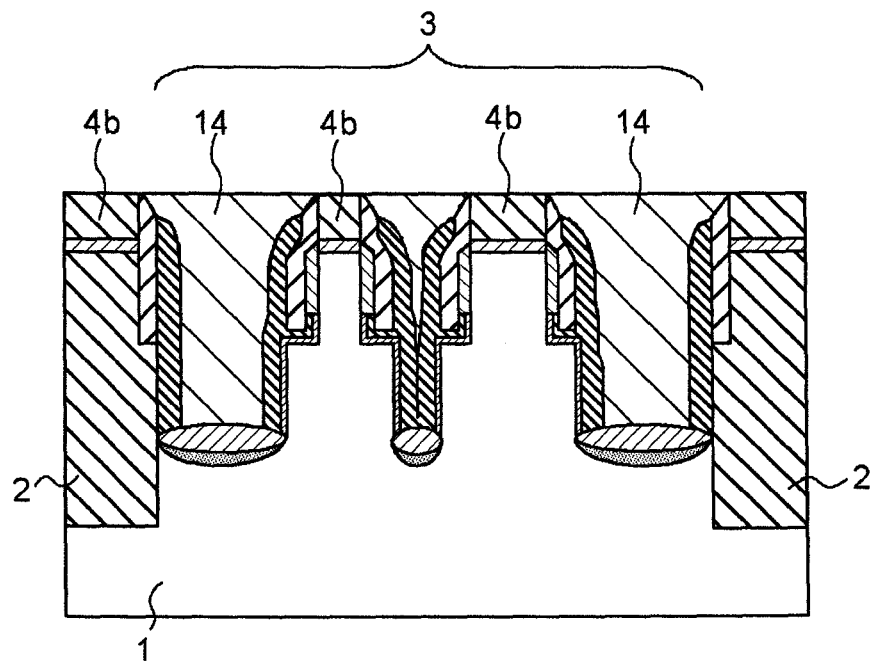
FIGS. 16 to 22 are schematic sectional views for illustrating a manufacturing process of the semiconductor device 50 of FIG. 1.

Next, as shown in FIG. 16, an interlayer insulation film 14 made of a silicon oxide film is formed on the whole surface of the silicon substrate 1 by the CVD method and a surface of the interlayer insulation film 14 is polished and smoothed by the CMP method. At this time, since the cap insulation film 4b functions as a CMP stopper, it is possible to securely control a film thickness of the interlayer insulation film 14. By doing so, the active area 3 is filled with the interlayer insulation film 14.

Figure 17:
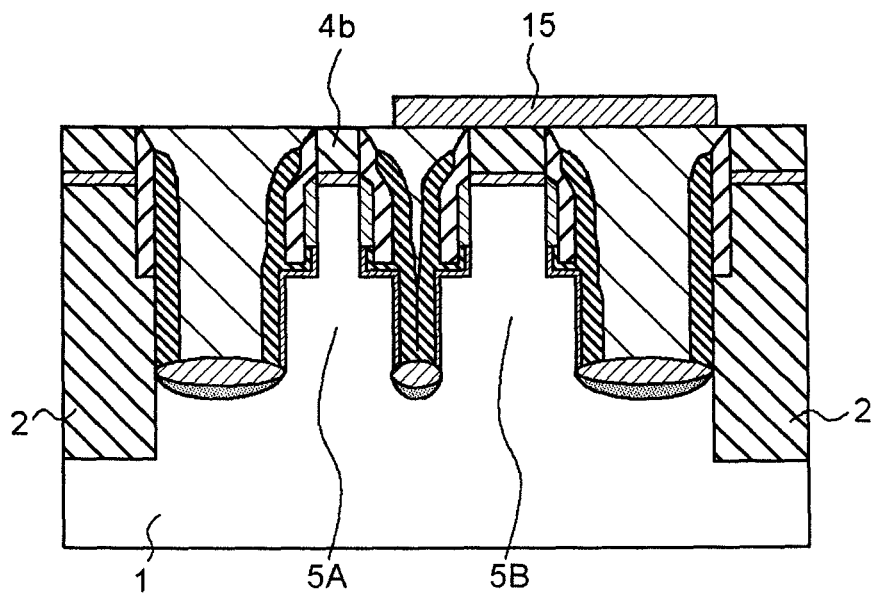

Next, as shown in FIG. 17, a mask oxide film 15 made of a silicon oxide film is formed on the whole surface of the silicon substrate 1. The mask oxide film 15 can be formed by the CVD method and a film thickness of the mask oxide film 15 is preferably about 20 nm. Then, the mask oxide film 15 is patterned by the photolithography and dry etching method so that the cap insulation film 4b configuring the first mask 4A formed above the first silicon pillar 5A is exposed and the cap insulation film 4b configuring the second mask 4B formed above the second silicon pillar 5B is protected.

Figure 18:
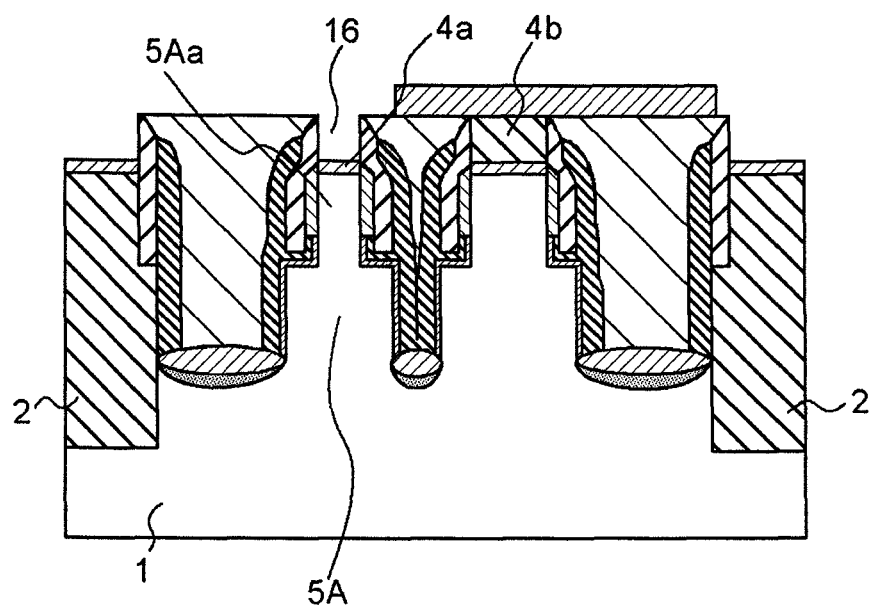

Next, as shown in FIG. 18, the exposed cap insulation film 4b is removed by the isotropic dry etching, so that a through-hole 16 having the protective insulation film 4a as a bottom surface is formed above the first silicon pillar 5A. At this time, since the cap insulation film 6b has a tapered upper part and is protected by the interlayer insulation film 14, it is little etched and remains as it is. Like this, since the through-hole 16 is formed by removing the cap insulation film 4b that is used as a mask when forming the first upper pillar 5Aa, the through-hole is formed in a self-alignment manner with respect to the first upper pillar 5Aa. Accordingly, a planar shape of the through-hole 16 that is surrounded by the cap insulation film 6b, which is a third insulation film, is the same as that of the upper surface of the first upper pillar 5Aa. In the meantime, the cap insulation film 4b above the STI 2 is also removed. Alternatively, the cap insulation film 4b above the STI 2 can be protected by the mask insulation film 15 so that it remains.

Figure 19:
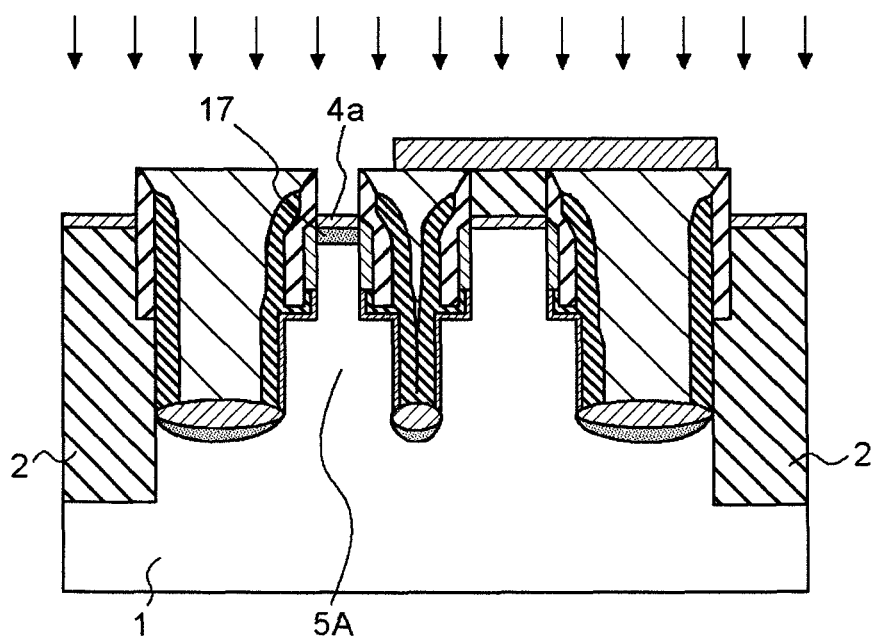

Next, as shown in FIG. 19, an LDD region 17 is formed on the upper part of the first silicon pillar 5A. The LDD region 17 can be formed by ion-implanting impurities of a low concentration, which have a conductive type opposite to the impurities in the silicon substrate 1, through the protective insulation film 4a formed on the upper surface of the first silicon pillar 5A.

Figure 20:
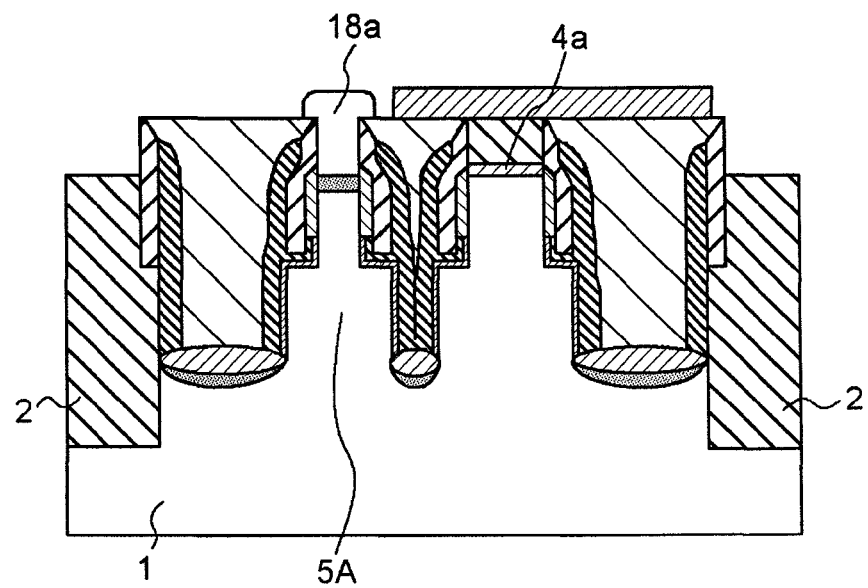

Next, as shown in FIG. 20, the protective insulation film 4a, which configures the first mask 4A on the bottom of the through-hole 16, is removed by the dry etching and the like, so that an opening is formed to expose the upper surface of the first silicon pillar 5A. Then, a silicon epitaxial layer 18a is formed in the through-hole 16 by a selective epitaxial growth method. At this time, the protective insulation film 4a on the STI 2 is also removed. However, it is not removed when the cap insulation film 4b is remained. In addition, the protective insulation film can be protected and remained by a separate mask.

Figure 21:
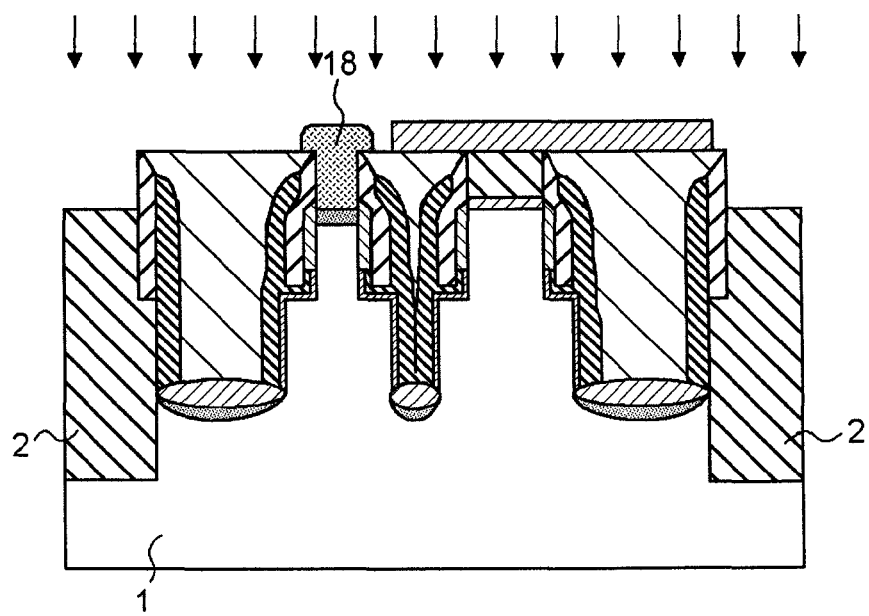

Next, as shown in FIG. 21, a second diffusion layer 18 is formed by ion-implanting impurities of a high concentration, which have a conductive type opposite to the impurities of the silicon substrate 1, into the silicon epitaxial layer 18a. Thereby, the second diffusion layer 18 is formed in a self-alignment manner with respect to the first silicon pillar 5A. In the meantime, since the protective insulation film 6a remains, the gate electrode 13A and the second diffusion layer 18 are not short-circuited.

Figure 22:
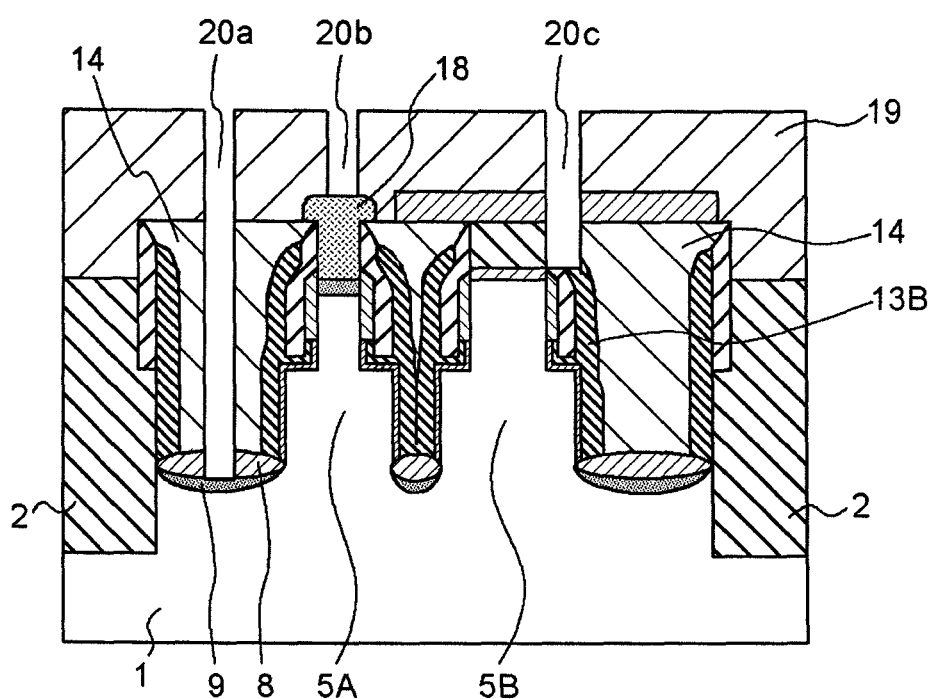

Next, as shown in FIG. 22, an interlayer insulation film 19 that is a silicon oxide film is formed on the whole surface of the silicon substrate 1 by the CVD method and is polished and smoothed by the CMP method. Then, the interlayer insulation film is patterned by the photolithography and dry etching method, so that first to third holes 20a to 20c are formed. The first contact hole 20a is formed in an empty area of the active area 3 provided near the first silicon pillar 5A and reaches the first diffusion layer 9 while penetrating the interlayer insulation films 19, 14 and the insulation film 8. The second contact hole 20b is formed just above the first silicon pillar 5A and reaches the second diffusion layer 18 while penetrating the interlayer insulation film 19. The third contact hole 20c is formed above the second silicon pillar 5B, although it is not formed just above the second silicon pillar 5B, and reaches the dummy gate electrode 13B while penetrating the interlayer insulation films 14 and 19.

Figure 23A:
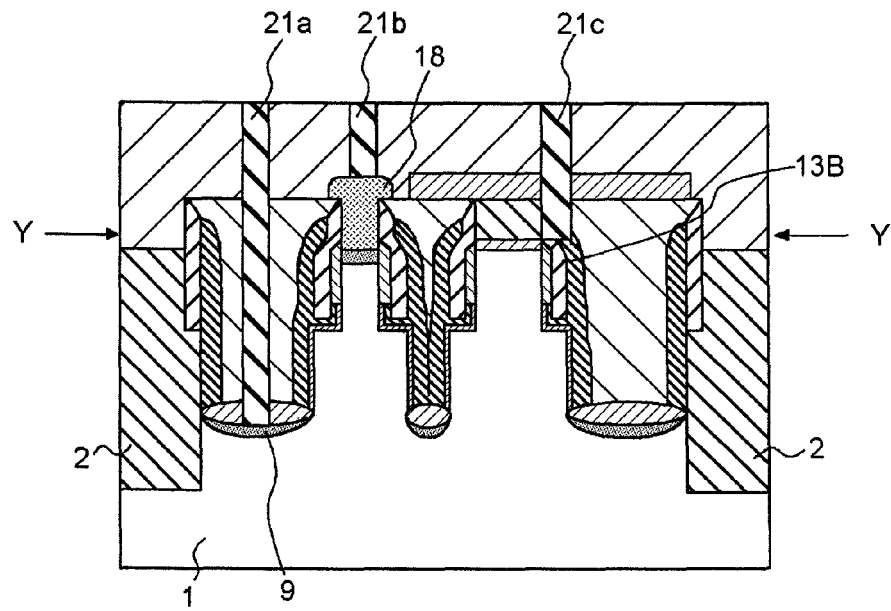
FIG. 23(a) is a schematic sectional view for illustrating a manufacturing process of the semiconductor device 50 of FIG. 1
Figure 23B:
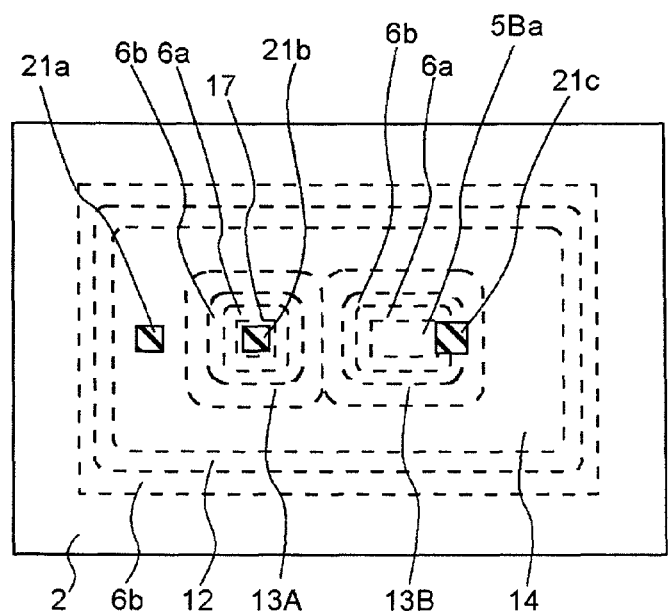
FIG. 23(b) is a schematic projective plan view in an YY part of FIG. 23(a).

Next, as shown in FIG. 23, polysilicon is embedded in the first to third contact holes 20a to 20c, so that first to third contact plugs 21a to 21c are formed. The first contact plug (first diffusion layer contact) 21a is connected to the first diffusion layer 9, the second contact plug (second diffusion layer contact) 21b is connected to the second diffusion layer 18 and the third contact plug (gate contact) 21c is connected to the dummy gate electrode 13B. In the meantime, FIG. 23(b) is a schematic projective plan view in an YY part of FIG. 23(a).

Lastly, a wiring layer 22 (22a to 22c) is formed on upper ends of the first to third contact plugs 21a to 21c, so that the semiconductor device 50 of this exemplary embodiment shown in FIG. 1 is completed.

As described above, according to the method for manufacturing the semiconductor device 50 of this exemplary embodiment, in the pre-process of forming the gate insulation film 11, when the thermal oxidation film formed on the side surface of the silicon pillar 5 is removed by the wet etching that is the isotropic etching, a part of the protective insulation film 6a configuring the sidewall mask 6 is dissolved and thus removed. The void 10, which is formed as the protective insulation film 6a is partially dissolved, is filled with the gate electrode 13. However, the remaining protective insulation film 6a covers the second diffusion layer 18 that is formed in the subsequent process. Accordingly, it is possible to sufficiently secure the electrical insulation without short-circuiting the gate electrode 13 and the second diffusion layer 18.

In this exemplary embodiment, the wiring layers 22a to 22c are formed on the same plane, but the wiring layers 22a to 22c can be formed on the different plane each other.

Figure 24:
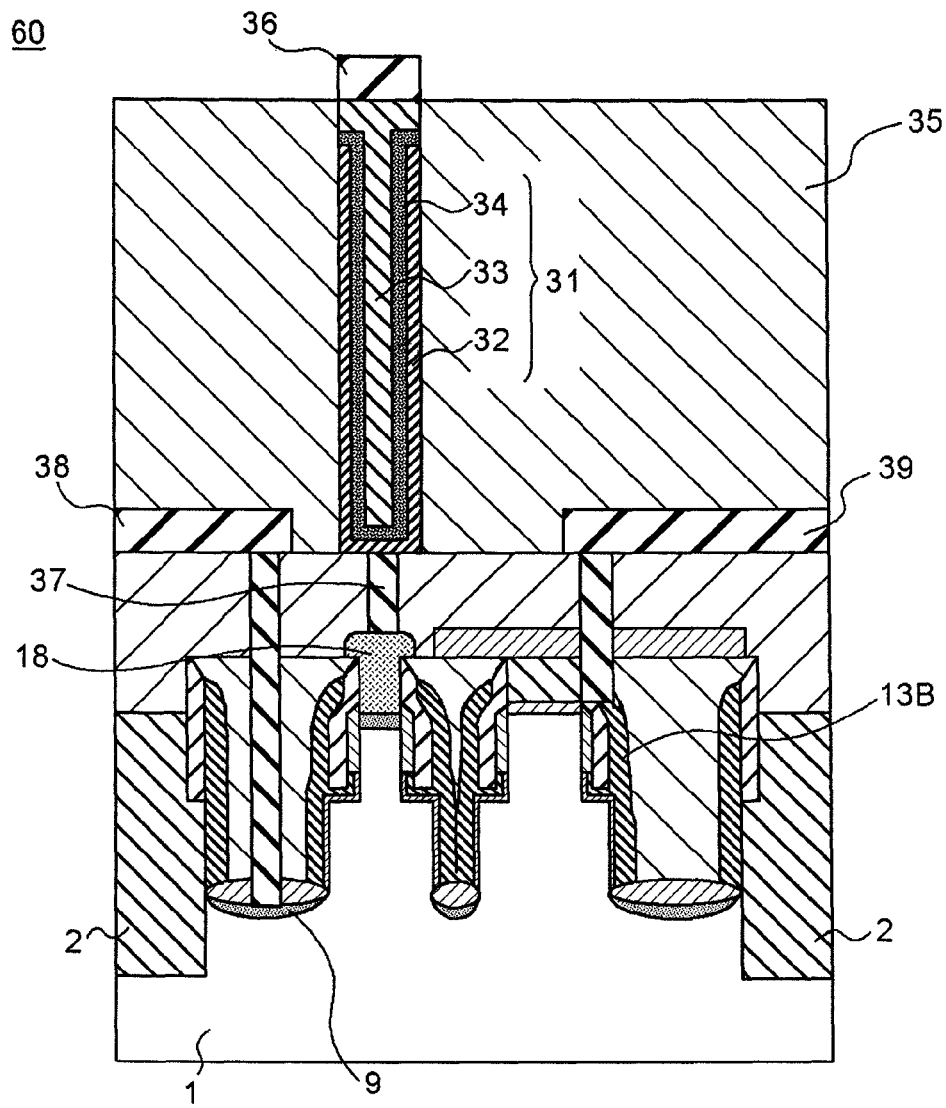
FIG. 24 is a schematic sectional view showing a structure of a semiconductor device 60 according to a preferred another embodiment of the invention.
Figure 25A:
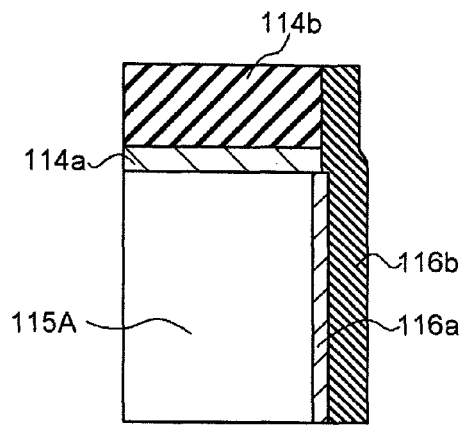
FIG. 25 is a schematic process sectional view for illustrating the problem to be solved by the invention.
Figure 25D:
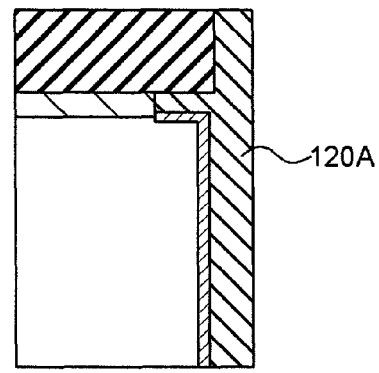
Figure 25B:
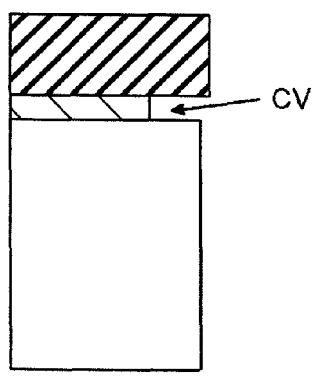
Figure 25E:
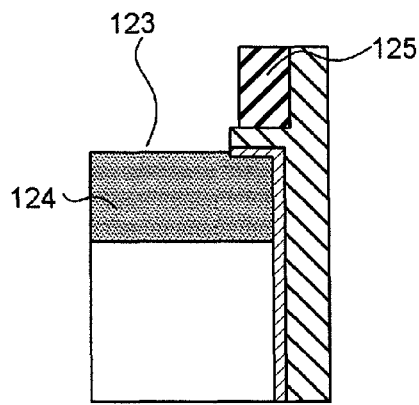
Figure 25C:
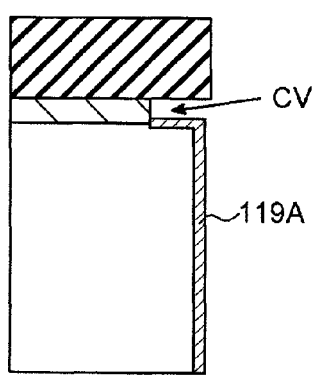
Figure 25F:
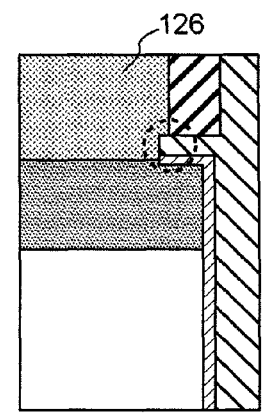

FIG. 24 is a schematic sectional view showing a semiconductor device 60 according to a preferred another exemplary embodiment of the invention.

As shown in FIG. 24, the semiconductor device 60 of this exemplary embodiment is a DRAM cell in which the vertical MOS transistor is used and a capacitor 31 is formed above the vertical MOS transistor becoming a cell transistor. A structure of the cell transistor is the same as that of the vertical MOS transistor of the semiconductor device 50 shown in FIG. 1.

The capacitor 31 has a cylindrical lower electrode 32, a columnar upper electrode 33 connected to a reference potential wiring 36 and a capacitive insulation film 34 provided between the lower electrode 32 and the upper electrode 33. The lower electrode 32 is formed in a cylinder hole that penetrates an interlayer insulation film 35 and is connected to the second diffusion layer 18 through a storage node contact 37. In addition, a part of the wiring layer (previously shown as 22a), which is connected to the first diffusion layer 9, is used as a bit line 38, and a part of the wiring layer (previously shown as 22c), which is connected to the dummy gate electrode 13B, is used as a word line 39.

Like this, according to the semiconductor device 60 of this exemplary embodiment, it is possible to sufficiently secure the electrical insulation of the small-sized DRAM cell using the vertical MOS transistor and to thus prevent short-circuit, thereby stabilizing the operation of the cell.

In the meantime, when a plurality of cell transistors of the DRAM is formed in one active area isolated by STI 2, the reference potentials that are applied to the respective capacitors of the cell transistors are respectively controlled to individually control the respective cell transistors.

Although the preferred exemplary embodiments of the invention have been described, it should be noted that the invention is not limited to the embodiments and can be variously changed without departing from the gist of the invention, which are included in the scope of the invention.

In addition, the invention includes following illustrative embodiments:

A. A method of manufacturing a semiconductor device including a vertical MOS transistor having conductive layers at upper and lower parts thereof in a normal direction of a semiconductor substrate, the method including the processes of:

forming a mask film on the semiconductor substrate;

etching the semiconductor substrate in the normal direction by using the mask film as a mask, thereby forming a first upper pillar having a first width and configuring the vertical MOS transistor;

forming a second insulation film on a side surface of the first upper pillar;

forming a third insulation film to cover the second insulation film and a side surface of the mask film;

forming a first lower pillar having a second width larger than the first width and configuring the vertical MOS transistor below the first upper pillar by using the third insulation film as a mask;

forming a sidewall insulation film covering a side surface of the first lower pillar and extending above the third insulation film;

forming a thermal oxidation film on an exposed surface of the semiconductor substrate;

implanting impurities for a first diffusion layer becoming the lower conductive layer through the thermal oxidation layer;

performing isotropic etching of removing the sidewall insulation film to expose the side surface of the first lower pillar;

forming a first insulation film on the exposed surface of the first lower pillar, and forming a conductive film on the first insulation film and the third insulation film.

B. The method according to the above A, wherein in the isotropic etching for exposing the side surface of the first lower pillar, the third insulation film is made of a material that has a slower etching rate that the second insulation film.

C. The method according to the above A or B, wherein the second insulation film is a silicon oxide film and the third insulation film is a silicon nitride film or silicon oxynitride film.

D. The method according to one of the above A to C, further including the processes of forming an interlayer insulation film to a height of the mask film after forming the conductive film on the first insulation film and the third insulation film;

removing the mask film on the first upper pillar configuring the vertical MOS transistor;

forming a semiconductor layer becoming the upper conductive layer on an exposed upper surface of the first upper pillar, and implanting impurities into the semiconductor layer to form a second diffusion layer.

E. The method according to one of the above A to D, wherein in the process of forming the mask film on the semiconductor substrate, a first mask forming the first upper pillar having the first width and configuring the vertical MOS transistor and a second mask having a third width adjacent to the first mask film are formed, and wherein in the process of forming the first upper pillar, a second upper pillar having the third width and becoming a dummy pillar is simultaneously formed.

F. The method according to the above E, wherein the third width is larger than the first width.

G. The method according to the above E or F, wherein the second insulation film and the third insulation film are formed on a side surface of the second upper pillar, simultaneously with the first upper pillar, and wherein a second lower pillar having a fourth width greater than the third width is formed below the second upper pillar by using the third insulation film as a mask.

H. The method according to one of the above G, wherein the first and second lower pillars are arranged so that the conductive film provided via the first insulation film is at least connected between the side surfaces of the first and second lower pillars, and wherein the conductive film is a gate electrode and a contact connected to the gate electrode is formed above the dummy pillar.

What is claimed is:

1. A semiconductor device comprising a vertical MOS transistor having upper and lower conductive layers at upper and lower parts thereof in a normal direction of a semiconductor substrate, the vertical MOS transistor comprising:
    a first semiconductor pillar comprising a first upper pillar having a first width and a first lower pillar having a second width larger than the first width and an upper surface around the first upper pillar on a main surface of the semiconductor substrate;
    a first insulation film that is provided on a side surface to at least a part of the upper surface of the first lower pillar;
    a second insulation film that is provided on a side surface of at least a part of the first upper pillar, and
    a third insulation film provided on the second insulation film and upwardly extended beyond an upper surface of the first semiconductor pillar,
    wherein the side surface of the first semiconductor pillar is continuously covered with the first and second insulation films.

2. The semiconductor device according to claim 1, wherein the first insulation film is extended to a part of the side surface of the first upper pillar not covered with the second insulation film.

3. The semiconductor device according to claim 1, wherein the second insulation film covers a whole side surface of the first upper pillar and provided on a part of the upper surface of the first lower pillar.

4. The semiconductor device according to claim 1, wherein the second insulation film and the third insulation film are made of different materials, respectively.

5. The semiconductor device according to claim 4, wherein the second insulation film is a silicon oxide film and the third insulation film is a silicon nitride film or silicon oxynitride film.

6. The semiconductor device according to claim 1, wherein the second insulation film is thicker than the first insulation film.

7. The semiconductor device according to claim 5, wherein the third insulation film is separated from the first insulation film to form a space therebetween and the first semiconductor pillar further comprises a first conductive film that covers a whole surface of the first insulation film and at least a part of the third insulation film and is provided to fill the space.

8. The semiconductor device according to claim 7, wherein the upper conductive layer is provided on an upper surface of the first semiconductor pillar, and
    wherein the upper conductive layer and the first conductive film are insulated by at least the second and third insulation films.

9. The semiconductor device according to claim 8, wherein the upper conductive layer comprises an epitaxially grown semiconductor layer containing impurities having an opposite conduction type to impurities in the semiconductor substrate.

10. The semiconductor device according to claim 7, a part of the third insulation film contacts the first upper pillar via the second insulation film and a bottom part of the third insulation film contacts the first lower pillar via the first insulation film and the first conductive film.

11. The semiconductor device according to claim 7, wherein the first insulation film and the first conductive film are a gate insulation film and a gate electrode of the vertical MOS transistor, respectively.

12. The semiconductor device according to claim 11, further comprising a dummy pillar that is adjacent to the first semiconductor pillar configuring the vertical MOS transistor;
    wherein the dummy pillar comprises:
    a second semiconductor pillar on a main surface of the semiconductor substrate,
    the first insulation film covering on at least a part of a side surface of the second semiconductor pillar, and
    a second conductive film insulated from the second semiconductor pillar; and
    wherein the second conductive film contacts with the first conductive film that is the gate electrode of the vertical MOS transistor.

13. The semiconductor device according to claim 12, wherein the second semiconductor pillar comprises a second upper pillar having a third width and a second lower pillar having a fourth width larger than the third width and an upper surface around the upper pillar;
    wherein the first insulation film is provided on a side surface to at least a part of the upper surface of the second lower pillar;
    wherein the second insulation film is provided on a side surface of at least a part of the second upper pillar;
    wherein the third insulation film is provided on the second insulation film and upwardly extended beyond an upper surface of the second semiconductor pillar;
    wherein the dummy pillar comprises fourth and fifth insulation films that have the same planar shapes as that of the second upper pillar on an upper surface of the second upper pillar;
    wherein the side surface of the second semiconductor pillar is continuously covered with the first and second insulation films; and
    wherein the third insulation film is separated from the first insulation film on the second lower pillar to form a space therebetween and the second conductive film covers a whole surface of the first insulation film on the second lower pillar and at least a part of the third insulation film and is provided to fill the space.

14. The semiconductor device according to claim 13, wherein the second semiconductor pillar has a same height with the first semiconductor pillar and the second lower pillar has a same height with the first lower pillar.

15. The semiconductor device according to claim 13, wherein the third width of the second upper pillar is wider than the first width of the first upper pillar and the third width of the second lower pillar is wider than the second width of the first lower pillar.

16. The semiconductor device according to claim 12, further comprising a contact connected to the second conductive film provided to the dummy pillar.

17. The semiconductor device according to claim 1, wherein the vertical MOS transistor is provided in an active area that is surrounded by a shallow trench isolation formed in the semiconductor substrate.

18. The semiconductor device according to claim 17, wherein an upper surface of an insulation film of the shallow trench isolation is position at an approximately same plane with the upper surface of the first semiconductor pillar.

19. The semiconductor device according to claim 1, further comprising at least three contacts electrically connected to the lower conductive layer, the upper conductive layer of the vertical MOS transistor and the first conductive layer, respectively.

20. The semiconductor device according to claim 1, further comprising a capacitor that is electrically connected to the upper conductive layer of the vertical MOS transistor.

\* \* \* \* \*